(12) United States Patent
Miyashita et al.

(10) Patent No.: US 7,623,586 B2
(45) Date of Patent: Nov. 24, 2009

(54) FREQUENCY AND PHASE CONTROL APPARATUS AND MAXIMUM LIKELIHOOD DECODER

(75) Inventors: Harumitsu Miyashita, Nara (JP); Takeshi Nakajima, Nara (JP); Naohiro Kimura, Kyoto (JP)

(73) Assignee: Panasonic Corporation, Kadoma (JP)

( * ) Notice: Subject to any disclaimer, the term of this patent is extended or adjusted under 35 U.S.C. 154(b) by 650 days.

(21) Appl. No.: 10/532,468

(22) PCT Filed: Oct. 20, 2003

(86) PCT No.: PCT/JP03/13400

§ 371 (c)(1),
(2), (4) Date: Apr. 22, 2005

(87) PCT Pub. No.: WO2004/038719

PCT Pub. Date: May 6, 2004

(65) Prior Publication Data

US 2006/0153041 A1 Jul. 13, 2006

(30) Foreign Application Priority Data

Oct. 23, 2002 (JP) ............................. 2002-308229

(51) Int. Cl.
*H04L 23/02* (2006.01)
*H04L 5/12* (2006.01)
(52) U.S. Cl. ........................ 375/262; 375/265; 375/273; 375/275
(58) Field of Classification Search ................. 375/262, 375/265, 267; 360/46, 51, 65; 714/792, 714/794
See application file for complete search history.

(56) References Cited

U.S. PATENT DOCUMENTS 4,475,234 A * 10/1984 Nishijima et al. ........... 382/101

(Continued)

FOREIGN PATENT DOCUMENTS

EP 0 750 306 12/1996

(Continued)

OTHER PUBLICATIONS

International Search Report for corresponding PCT/JP2003/013400, mailed Jul. 13, 2004.

(Continued)

*Primary Examiner*—Chieh M Fan
*Assistant Examiner*—Qutbuddin Ghulamali
(74) *Attorney, Agent, or Firm*—Renner, Otto, Boisselle & Sklar, LLP

(57) ABSTRACT

A frequency and phase control apparatus includes an analog/digital conversion section for converting a reproduction signal into a multiple bit digital signal based on a clock signal; a maximum likelihood decoding section for converting the multiple bit digital signal into a binary signal; a pattern detection section for detecting a pattern of the binary signal; and a determination section for determining whether or not the multiple bit digital signal and the clock signal are in synchronization with each other based on the detection result. When the determination result of the determination section indicates that the multiple bit digital signal and the clock signal are in synchronization with each other, the maximum likelihood decoding section generates a binary signal based on a first state transition rule; otherwise, the maximum likelihood decoding section generates a binary signal based on a second state transition rule.

4 Claims, 24 Drawing Sheets

U.S. PATENT DOCUMENTS

| | | | | |
|---|---|---|---|---|
| 4,811,361 | A | * | 3/1989 | Bacou et al. ................ 375/242 |
| 5,555,024 | A | * | 9/1996 | Limberg ..................... 348/473 |
| 5,565,930 | A | * | 10/1996 | Bolger et al. ............... 348/572 |
| 5,638,065 | A | * | 6/1997 | Hassner et al. ............... 341/59 |
| 5,920,214 | A | | 7/1999 | Lee et al. |
| 5,999,561 | A | * | 12/1999 | Naden et al. ................ 375/142 |
| 6,003,153 | A | * | 12/1999 | Shimoda ..................... 714/792 |
| 6,023,386 | A | * | 2/2000 | Reed et al. .................... 360/51 |
| 6,118,393 | A | | 9/2000 | Chiba et al. |
| 2002/0180488 | A1 | | 12/2002 | Kojima |

FOREIGN PATENT DOCUMENTS

| | | |
|---|---|---|
| EP | 0 750 306 A | 12/1996 |
| EP | 0 822 552 | 2/1998 |
| EP | 0 822 552 A | 2/1998 |
| JP | 2001-167532 | 6/2001 |

OTHER PUBLICATIONS

European Search Report for corresponding Application No. 08150740.2 dated Apr. 4, 2008.

Otte R. et al.; "Evaluation of Adaptive PRML/Miterbi Bit Detection for DVD and Beyond"; IEEE Transactions on Consumer Electronics, IEEE Service Center, New York, NY; vol. 46, No. 4; Nov. 2000; pp. 1018-1020; XP001197662.

* cited by examiner

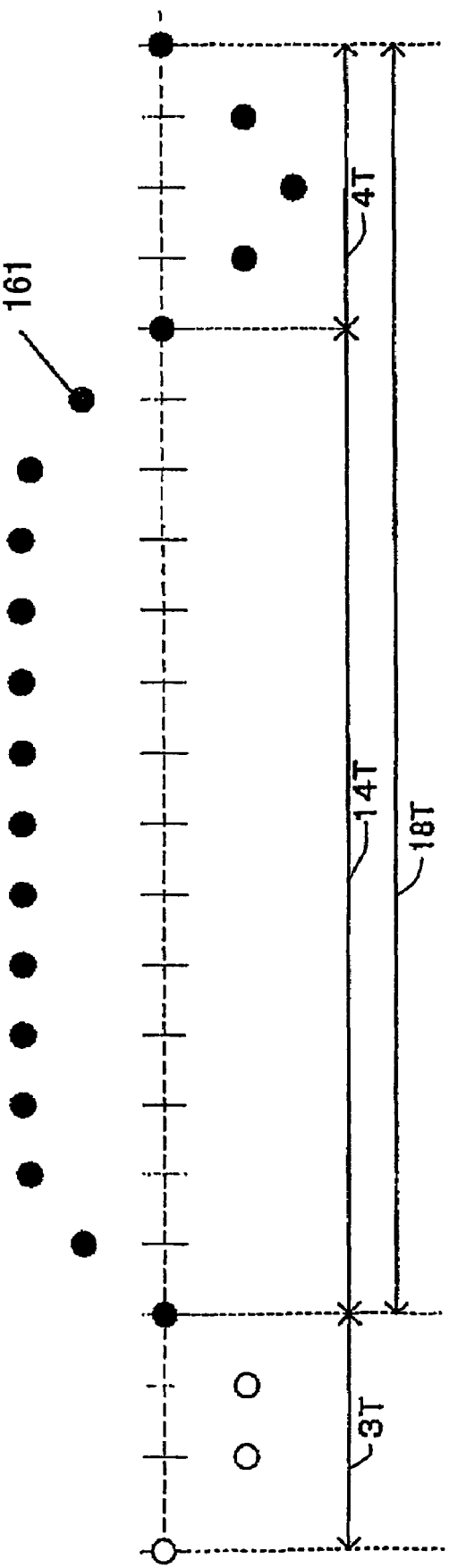

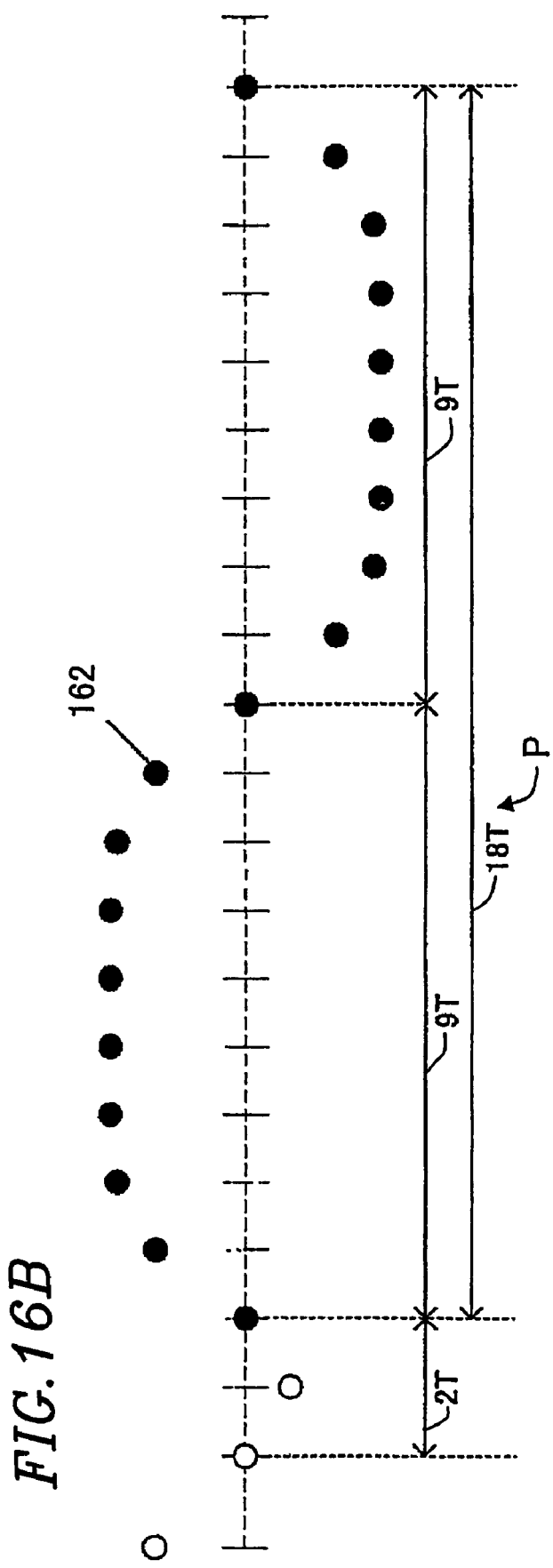

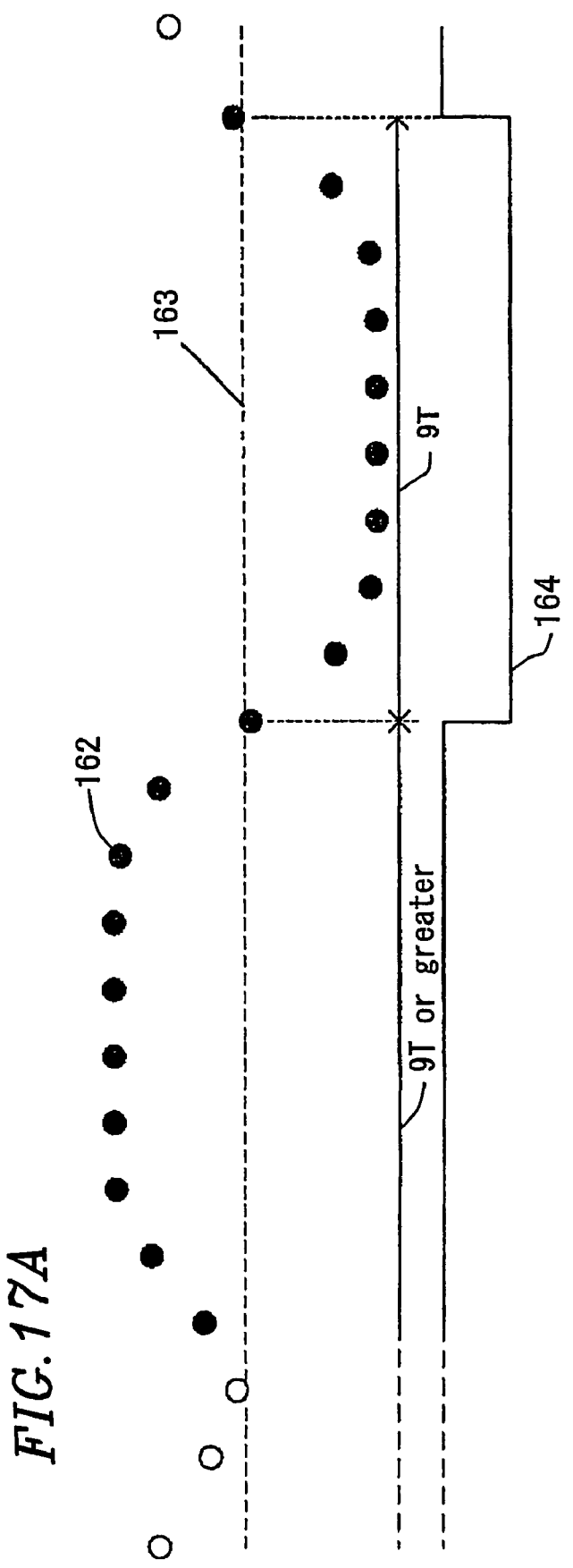

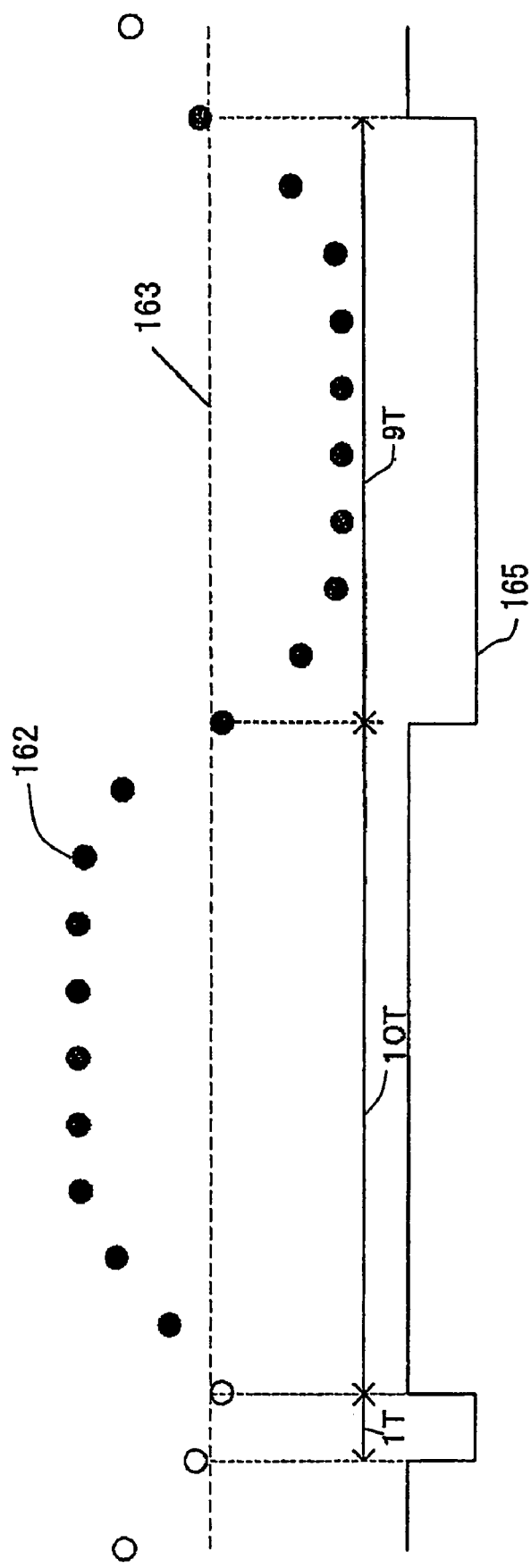

Input/output

FREQUENCY AND PHASE CONTROL APPARATUS AND MAXIMUM LIKELIHOOD DECODER

TECHNICAL FIELD

The present invention relates to a frequency and phase control apparatus and a maximum likelihood decoder, and specifically to a frequency and phase control apparatus and a maximum likelihood decoder for realizing stable PLL (Phase-Locked Loop) phase synchronization for data reproduction based on a clock signal.

BACKGROUND ART

Digital data is often recorded on an optical disc medium using a system of uniformizing the linear velocity and thus uniformizing the recording density on the medium, as performed for a CD (Compact Disc), a DVD (Digital Versatile Disc) and the like. Data is recorded on the optical disc medium as being digitally modulated in the width of marks such that the linear recording density is uniform. Therefore, when the data is reproduced from the optical disc medium, the following inconvenience may occur. In the case where the frequency of a clock component of the reproduction signal is significantly different from the frequency of a clock signal generated by a phase synchronization loop circuit, there is an undesirable possibility that the phase synchronization is not completed, or the clock signal is pseudo-synchronized with a frequency which is different from the frequency of the clock component of the reproduction signal. In order to avoid these inconveniences, a reproduction linear velocity period of the reproduction signal is detected based on a specific pulse length or pulse interval included in the reproduction signal, and the rotation rate of the disc and the free-running frequency of the phase synchronization loop are controlled. Thus, normal phase synchronization is realized.

FIG. 22 shows a conventional frequency and phase control apparatus 180 described in Japanese Laid-Open Publication No. 2000-836602. The frequency and phase control apparatus 180 includes a waveform equalizing section 181, an analog/digital converter 182, a low frequency band noise suppression section 183, a zero-cross length detector 184, a frame counter 185, a maximum pattern length detector 186, a minimum pattern length detector 187, a cycle information determinator 188, a frequency error detector 189, a phase error detector 190, a frequency control loop filter 191, a phase control loop filter 192, digital/analog converters 193 and 194, and an oscillator 195.

The waveform equalizing section 181 emphasizes a prescribed frequency band of a reproduction signal. The analog/digital converter 182 converts the reproduction signal into multiple-bit digital data based on a reproduction clock signal. The low frequency band noise suppression section 183 suppresses low frequency band noise included in the multiple bit digital data. The zero-cross length detector 184 detects the position at which the signal having a suppressed low frequency band noise component crosses the zero level (zero-cross point), counts the number of samples between two adjacent zero-cross points (zero-cross length) based on the reproduction clock signal, and holds the counted number in a register (not shown).

The frame counter 185 counts and sets a specific period of one frame or greater. The maximum pattern length detector 186 and the minimum pattern length detector 187 respectively detect a maximum value and a minimum value of the zero-cross lengths (pattern lengths) counted by the zero-cross length detector 184 in a prescribed period (or a period corresponding to the sum of the adjacent counted zero-cross lengths). The cycle information determinator 188 compares the maximum value and the minimum value of the counted zero-cross lengths (pattern lengths), and selects an optimum value as cycle information utilizing the ratio of the maximum value and the minimum value. The frequency error detector 189 converts the difference between the cycle information and the maximum value or the difference between the cycle information and the minimum value into a frequency error amount and outputs the frequency error amount. The maximum value and the minimum value are to be detected at the time of phase synchronization. The frequency error detector 189 finds a synchronization pattern from the maximum pattern, converts the interval between two adjacent synchronization patterns into a frequency error amount, and outputs the frequency error amount.

The frequency control loop filter 191 controls the reproduction clock signal until a state where a reproduction clock signal can be considered to be synchronized with a reproduction digital signal is obtained based on the output from the frequency error detector 189. The phase error detector 190 detects phase information from the signal having a suppressed low frequency band noise component. The phase control loop filter 192 controls the reproduction clock signal such that the reproduction clock signal is synchronized with the reproduction digital signal based on the output from the phase error detector 190.

The oscillator 195 generates and oscillates the reproduction clock signal based on a sum value of the output from the frequency control loop filter 191 and the output from the phase control loop filter 192 via the digital/analog converters 193 and 194.

As described above, the frequency and phase control apparatus 180 detects the position at which the reproduction signal crosses the reference level (zero level) and thus detects a specific pulse length (synchronization pattern length) included in a reproduction signal. In order to prevent the quality of the reproduction signal from being lowered due to increase in the recording density of a recording medium (due to increase in inter-symbol interference) and also in order to improve the formatting efficiency, a new format standard has appeared by which, for example, the distance between a synchronization pattern and a maximum data pattern is shortened. This new format standard has disabled accurate detection of a synchronization pattern, which has made it difficult to stably complete the frequency synchronization.

For example, FIG. 16A shows a 14T4T synchronization pattern used for DVDs. This synchronization pattern has a long inter-symbol distance from a maximum data pattern 11T, and thus is conspicuous. Here, "T" represents a cycle of a clock signal. Reference numeral 161 represents a sampling signal. In the next generation optical disc developed for higher recording density, it is necessary to use, for example, a (1,7) RLL (Run Length Limited) modulation symbol or a specific synchronization pattern in order to improve the formatting efficiency. The (1, 7) RLL modulation symbol is usually used for HDDs (hard disc drives). FIG. 16B shows a synchronization pattern P according to an example of the present invention described below. Here, a (1, 7) RLL modulation symbol is used as a recording symbol. The synchronization pattern P is a 9T9T pattern. Reference numeral 162 represents a sampling signal. The synchronization pattern P has a shorter inter-symbol distance from a maximum data pattern of 8T8T, and thus is not conspicuous. Before the 9T9T synchronization pattern P, the minimum pattern of 2T necessarily exists. When the minimum pattern of 2T does not exceed a slicing level 163 (zero-level) as shown in, for example, FIG. 17A due to the influence of inter-symbol interference or the like, the pattern of 9T is detected as a pattern of 9T or greater. Thus, no synchronization pattern is detected from a binary signal 164. When the minimum pattern of 2T partially exceeds the slicing level 163 as shown in FIG. 17B, the pattern of 9T is detected as a pattern of 10T. Thus, no synchronization pattern is detected from a binary signal 165.

Thus, the invention described herein makes possible the advantages of providing a frequency and phase control apparatus and a maximum likelihood apparatus for accurately detecting a synchronization pattern and thus stably performing synchronization even when the quality of a reproduction signal is deteriorated.

These and other advantages of the present invention will become apparent to those skilled in the art upon reading and understanding the following detailed description with reference to the accompanying figures.

DISCLOSURE OF THE INVENTION

According to one aspect of the invention, a frequency and phase control apparatus includes a signal input section for receiving a reproduction signal; an analog/digital conversion section for converting the reproduction signal into a multiple bit digital signal based on a clock signal; a maximum likelihood decoding section for converting the multiple bit digital signal into a binary signal; a pattern detection section for detecting a pattern of the binary signal; a determination section for determining whether or not the multiple bit digital signal and the clock signal are in synchronization with each other based on the detection result; and a clock generation section for adjusting at least one of a frequency and a phase of the clock signal based on the detection result and outputting the adjusted clock signal. When the determination result of the determination section indicates that the multiple bit digital signal and the clock signal are in synchronization with each other, the maximum likelihood decoding section generates a binary signal based on a first state transition rule; and when the determination result of the determination section indicates that the multiple bit digital signal and the clock signal are not in synchronization with each other, the maximum likelihood decoding section generates a binary signal based on a second state transition rule.

In one embodiment of the invention, a number of states and a number of state transition paths of the first state transition rule are restricted based on a first minimum inversion interval defined by a prescribed symbol rule. A number of states and a number of state transition paths of the second state transition rule are restricted based on a second minimum inversion interval which is shorter than the first minimum inversion interval.

In one embodiment of the invention, the first minimum inversion interval is 2, the second minimum inversion interval is 1, the first state transition rule includes 6 states and 10 state transition paths based on a combination of a recording symbol having the first minimum inversion interval and a PR (a, b, b, a) system, and the second state transition rule includes 8 states and 16 state transition paths based on a combination of a recording symbol having the second minimum inversion interval and the PR (a, b, b, a) system.

In one embodiment of the invention, the first minimum inversion interval is 3, the second minimum inversion interval is 1, the first state transition rule includes 6 states and 8 state transition paths based on a combination of a recording symbol having the first minimum inversion interval and a PR (a, b, b, a) system, and the second state transition rule includes 8 states and 16 state transition paths based on a combination of a recording symbol having the second minimum inversion interval and the PR (a, b, b, a) system.

In one embodiment of the invention, the first minimum inversion interval is 2, the second minimum inversion interval is 1, the first state transition rule includes 4 states and 6 state transition paths based on a combination of a recording symbol having the first minimum inversion interval and a PR (a, b, a) system, and the second state transition rule includes 4 states and 8 state transition paths based on a combination of a recording symbol having the second minimum inversion interval and the PR (a, b, a) system.

In one embodiment of the invention, the first minimum inversion interval is 3, the second minimum inversion interval is 1, the first state transition rule includes 4 states and 6 state transition paths based on a combination of a recording symbol having the first minimum inversion interval and a PR (a, b, a) system, and the second state transition rule includes 4 states and 8 state transition paths based on a combination of a recording symbol having the second minimum inversion interval and the PR (a, b, a) system.

In one embodiment of the invention, the first minimum inversion interval is 2, the second minimum inversion interval is 1, the first state transition rule includes 10 states and 16 state transition paths based on a combination of a recording symbol having the first minimum inversion interval and a PR (a, b, c, b, a) system, and the second state transition rule includes 16 states and 32 state transition paths based on a combination of a recording symbol having the second minimum inversion interval and the PR (a, b, c, b, a) system.

In one embodiment of the invention, the first minimum inversion interval is 3, the second minimum inversion interval is 1, the first state transition rule includes 8 states and 12 state transition paths based on a combination of a recording symbol having the first minimum inversion interval and a PR (a, b, c, b, a) system, and the second state transition rule includes 16 states and 32 state transition paths based on a combination of a recording symbol having the second minimum inversion interval and the PR (a, b, c, b, a) system.

In one embodiment of the invention, the first minimum inversion interval is 3, the second minimum inversion interval is 2, the first state transition rule includes 6 states and 8 state transition paths based on a combination of a recording symbol having the first minimum inversion interval and a PR (a, b, b, a) system, and the second state transition rule includes 6 states and 12 state transition paths based on a combination of a recording symbol having the second minimum inversion interval and the PR (a, b, b, a) system.

In one embodiment of the invention, the first minimum inversion interval is 3, the second minimum inversion interval is 2, the first state transition rule includes 4 states and 6 state transition paths based on a combination of a recording symbol having the first minimum inversion interval and a PR (a, b, a) system, and the second state transition rule includes 4 states and 6 state transition paths based on a combination of a recording symbol having the second minimum inversion interval and the PR (a, b, a) system.

In one embodiment of the invention, the first minimum inversion interval is 3, the second minimum inversion interval is 2, the first state transition rule includes 8 states and 12 state transition paths based on a combination of a recording symbol having the first minimum inversion interval and a PR (a, b, c, b, a) system, and the second state transition rule includes 10 states and 16 state transition paths based on a combination of a recording symbol having the second minimum inversion interval and the PR (a, b, c, b, a) system.

In one embodiment of the invention, when intervals between a plurality of synchronization patterns included in the detected pattern have a defined value for a prescribed number of times in series, the determination section determines that the multiple bit digital signal and the clock signal are in synchronization with each other. When intervals between a plurality of synchronization patterns included in the detected pattern do not have a defined value for a prescribed number of times in series, the determination section determines that the multiple bit digital signal and the clock signal are not in synchronization with each other.

According to another aspect of the invention, a frequency and phase control apparatus includes a signal input section for receiving a reproduction signal; an analog/digital conversion section for converting the reproduction signal into a multiple bit digital signal based on a clock signal; a maximum likelihood decoding section for converting the multiple bit digital signal into a binary signal; a maximum cross length detection section for detecting a plurality of cross lengths each representing a length between two adjacent cross points among a plurality of cross points at which the reproduction signal crosses a prescribed slicing level, and detecting a maximum value among sums of two adjacent cross lengths; a minimum cross length detection section for detecting the plurality of cross lengths and detecting a minimum value among the sums of the two adjacent cross lengths; and a clock generation section for adjusting at least one of a frequency and a phase of the clock signal based on the maximum value and the minimum value, and outputting the adjusted clock signal. The maximum cross length detection section detects the maximum value based on the binary signal.

In one embodiment of the invention, the maximum likelihood decoding section generates a binary signal based on a state transition rule. A number of states and a number of state transition paths of the state transition rule are restricted based on a minimum inversion interval defined by a prescribed symbol rule.

In one embodiment of the invention, the minimum inversion interval is 2, and the state transition rule includes 6 states and 10 state transition paths based on a combination of a recording symbol having the minimum inversion interval and a PR (a, b, b, a) system.

In one embodiment of the invention, the minimum inversion interval is 3, and the state transition rule includes 6 states and 8 state transition paths based on a combination of a recording symbol having the minimum inversion interval and a PR (a, b, b, a) system.

In one embodiment of the invention, the minimum inversion interval is 2, and the state transition rule includes 4 states and 6 state transition paths based on a combination of a recording symbol having the minimum inversion interval and a PR (a, b, a) system.

In one embodiment of the invention, the minimum inversion interval is 3, and the state transition rule includes 4 states and 6 state transition paths based on a combination of a recording symbol having the minimum inversion interval and a PR (a, b, a) system.

In one embodiment of the invention, the minimum inversion interval is 2, and the state transition rule includes 10 states and 16 state transition paths based on a combination of a recording symbol having the minimum inversion interval and a PR (a, b, c, b, a) system.

In one embodiment of the invention, the minimum inversion interval is 3, and the state transition rule includes 8 states and 12 state transition paths based on a combination of a recording symbol having the minimum inversion interval and a PR (a, b, c, b, a) system.

According to still another aspect of the invention, a maximum likelihood decoder is provided for receiving a multiple bit digital signal generated based on a clock signal and a flag indicating whether or not the multiple bit digital signal and the clock signal are in synchronization with each other, and converting the multiple bit digital signal into a binary signal based on the flag. When the flag indicates that the multiple bit digital signal and the clock signal are in synchronization with each other, the maximum likelihood decoder generates a binary signal based on a first state transition rule, and when the flag indicates that the multiple bit digital signal and the clock signal are not in synchronization with each other, the maximum likelihood decoder generates a binary signal based on a second state transition rule.

According to a frequency and phase control apparatus of the present invention, a specific pattern length is detected based on the maximum likelihood decoding result both in a frequency and phase synchronous state and a frequency and phase asynchronous state. Therefore, the synchronization pattern length and the minimum pattern length can be detected more accurately than in the conventional art even when (i) the quality of the reproduction signal is poor, (ii) the distance between the data and the synchronization pattern is short, and (iii) the minimum pattern is provided immediately before or immediately after the synchronization pattern. Since the frequency error amount and the phase error amount can be detected with high precision, the reproduction clock signal can be synchronized stably.

According to a frequency and phase control apparatus and a maximum likelihood decoder of the present invention, different state transition rules are used in a frequency and phase synchronous state and in a frequency and phase asynchronous state. Since a state transition rule using a symbol rule is adopted in the frequency and phase synchronous state, the performance of the maximum likelihood decoder can be utilized at the maximum. In the frequency and phase asynchronous state, a state transition rule which can detect even a 1T pattern is used. Thus, the specific pattern length can be detected more accurately in all the states of the frequency and phase synchronous state and the frequency and phase asynchronous state.

BRIEF DESCRIPTION OF THE DRAWINGS

FIGS. 16A and 16B show a synchronization pattern;

FIGS. 17A and 17B show erroneous detection of a synchronization pattern;

BEST MODE FOR CARRYING OUT THE INVENTION

Hereinafter, the present invention will be described by way of examples with reference to the attached drawings.

EXAMPLE 1

Figure 1:
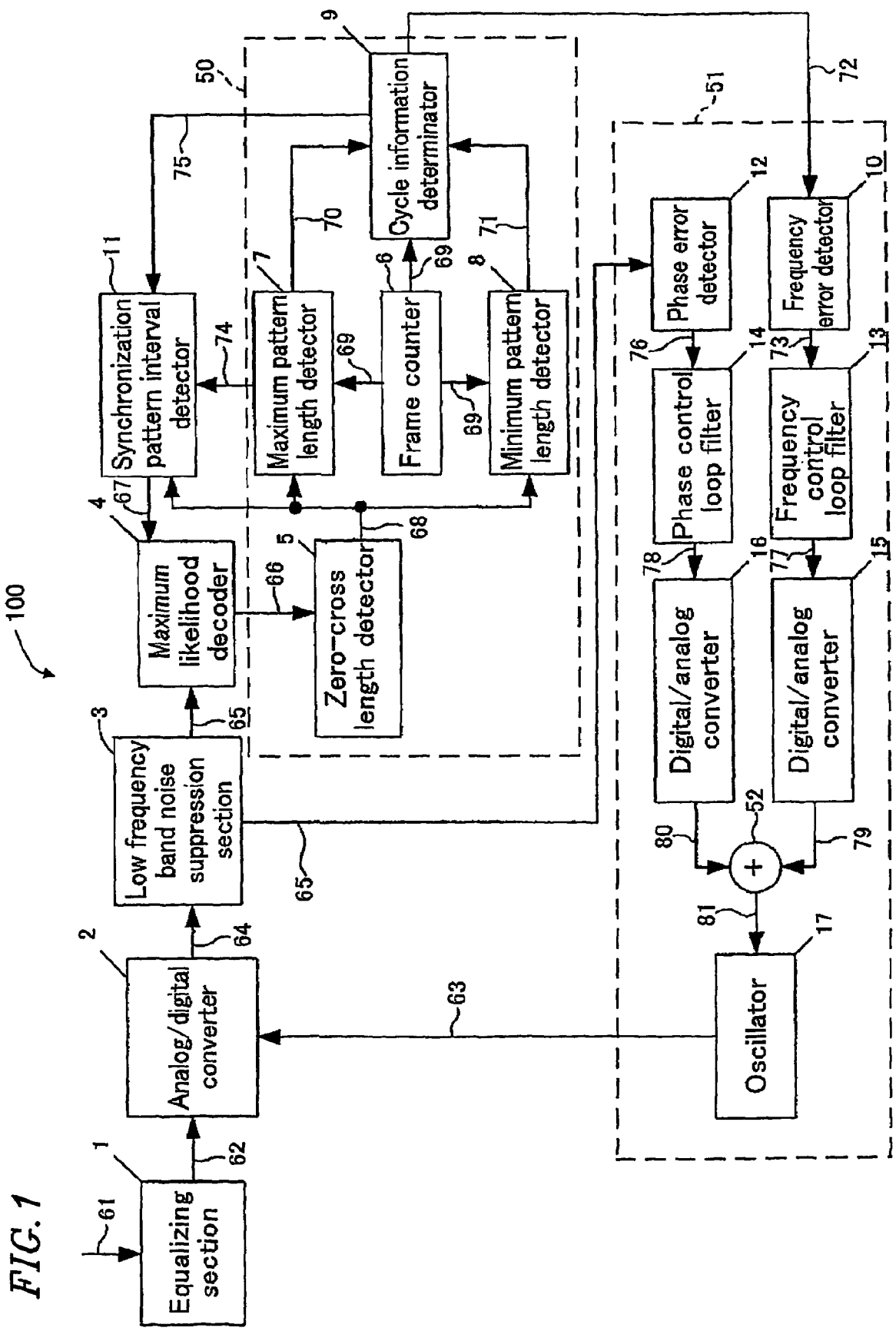
FIG. 1 is a block diagram illustrating a frequency and phase control apparatus according to one example of the present invention.

FIG. 1 is a block diagram illustrating a frequency and phase control apparatus 100 according to a first example of the present invention.

The frequency and phase control apparatus 100 includes a waveform equalizing section 1, an analog/digital converter 2, a low frequency band noise suppression section 3, a maximum likelihood decoder 4, a binary signal pattern detection section 50, a synchronization pattern interval detection section 11, and a clock generation section 51.

The binary signal pattern detection section 50 includes a zero-cross length detector 5, a frame counter 6, a maximum pattern length detector 7, a minimum pattern length detector 8, and a cycle information determinator 9. The clock generation section 51 includes a frequency error detector 10, a phase error detector 12, a frequency control loop filter 13, a phase control loop filter 14, digital/analog converters 15 and 16, an adder 52 and an oscillation section 17.

The waveform equalizing section 1 acts as a signal input section for receiving a reproduction signal 61 from an optical head section (not shown) or the like, which has read data from an optical disc medium. The waveform equalizing section 1 corrects the reproduction signal 61 for emphasizing a high frequency band. The waveform equalizing section 1 includes a filter for arbitrarily setting a boost amount and a cut-off frequency. The filter can be, for example, a high-order ripple filter. The analog/digital converter 2 converts the reproduction signal (an analog signal labeled with 62) which is output from the waveform equalizing section 1 into a multiple bit digital signal 64 based on a reproduction clock signal 63. The low frequency band noise suppression section 3 suppresses a low frequency band noise component included in the multiple bit digital signal 64. The low frequency band noise suppression section 3 includes a circuit for detecting a DC component included in the multiple bit digital signal 64 and a circuit for subtracting the detected DC component from the multiple bit digital signal 64. The low frequency band noise suppression section 3 outputs a multiple bit digital signal 65 having a suppressed low frequency band noise component.

The maximum likelihood decoder 4 performs maximum likelihood decoding on the multiple bit digital signal 65 using a Viterbi algorithm to covert the multiple bit digital signal 65 into a binary signal 66. The maximum likelihood decoder 4 changes the number of states and the number of state transitions of the state transition rule based on a synchronization confirmation flag 67 output from the synchronization pattern interval detector 11.

Based on the binary signal 66 output from the maximum likelihood decoder 4, the zero-cross length detector 5 continuously detects positions at which the reproduction signal 61 cross a slicing level (zero-level). In other words, the reproduction signal 61 changes from "1" to "0" or "0" to "1" at these positions. The zero-cross length detector 5 counts the number of samples between two adjacent zero-cross points based on the reproduction clock signal 63, and holds the counted value in a register (not shown) as a zero-cross length. The zero-cross length detector 5 outputs a signal 68 which represents a sum of two adjacent zero-cross lengths. The frame counter 6 counts and sets a specific period of one frame or greater based on the signal 68 and the reproduction clock signal 63. The frame counter 6 outputs a signal 69 which represents the set period.

The maximum pattern length detector 7 detects a maximum value among sums of two adjacent zero-cross lengths in the period represented by the signal 69, and holds the maximum value as a maximum pattern length in a register (not shown). The maximum pattern length detector 7 outputs a signal 70 which represents the maximum pattern length. The minimum pattern length detector 8 detects a minimum value among the sums of two adjacent zero-cross lengths in the period represented by the signal 69, and holds the minimum value as a minimum pattern length in a register (not shown). The minimum pattern length detector 8 outputs a signal 71 which represents the minimum pattern length. The cycle information determinator 9 compares the maximum pattern length represented by the signal 70 and the minimum pattern length represented by the signal 71, and selects an optimum value as cycle information using the ratio of the maximum pattern length and the minimum pattern length (comparison result), and outputs a select signal 72 representing the optimum value.

The frequency error detector 10 converts the difference between the value represented by the select signal 72 and the maximum pattern length or the difference between the value represented by the select signal 72 and the minimum pattern length into a frequency error amount, and outputs a signal 73 representing the frequency error amount. The maximum pattern length and the minimum pattern length are to be detected at the time of clock synchronization.

The synchronization pattern interval detector 11 detects positions of synchronization patterns using the signal 68, a synchronization determination flag 74 output from the maximum pattern length detector 7, and a flag 75 representing a synchronization pattern length which is output from the cycle information determinator 9. The synchronization pattern interval detector 11 detects an interval between adjacent synchronization patterns (synchronization pattern interval) based on the detected positions of the synchronization patterns. When the interval is a prescribed value for a prescribed number of times in series, the synchronization pattern interval detector 11 outputs the synchronization confirmation flag 67.

The phase error detector 12 detects phase information of the multiple bit digital signal 64 from the multiple bit digital signal 65. The phase error detector 12 outputs a signal 76 which represents the phase information. The frequency control loop filter 13 performs frequency control of the reproduction clock signal 63 until a state where the reproduction clock signal 63 can be considered to be synchronized with the multiple bit digital signal 64 is obtained, using the frequency error amount represented by the signal 73. The phase error loop filter 14 performs phase control of the reproduction clock signal 63 such that the reproduction clock signal 63 is synchronized with the multiple bit digital signal 64, using the signal 76.

The digital/analog converter 15 converts a digital signal 77 output from the frequency control loop filter 13 into an analog signal 79 and outputs the analog signal 79. The digital/analog converter 16 converts a digital signal 78 output from the phase control loop filter 14 into an analog signal 80 and outputs the analog signal 80. The adder 52 outputs a signal 81 obtained by adding the analog signals 79 and 80. The oscillator 17 generates the reproduction clock signal 63 based on the signal 81.

An operation of the frequency and phase control apparatus 100 will be further described.

The waveform equalizing section 1 corrects the reproduction signal 61 to emphasize a high frequency band. The analog/digital converter 2 converts the reproduction signal 62 output from the waveform equalizing section 1 into the multiple bit digital signal 64 based on the reproduction clock signal 63. The multiple bit digital signal 64 is in phase with the reproduction clock signal 63. All the data processing (counting and the like) to be performed after this stage is performed based on the reproduction clock signal 63. The sampled multiple bit-digital signal 64 is input to the low frequency band noise suppression section 3 and has a low frequency band noise component thereof suppressed.

The signal 65 having a suppressed low frequency band noise component is input to the maximum likelihood decoder 4 and is converted into a binary signal 66 which is represented by "1" or "0". The maximum likelihood decoder 4 changes the number of states and the number of state transitions of the state transition rule, based on the synchronization confirmation flag 67, which is provided for identifying an asynchronous state and a synchronous state output from the synchronization pattern interval detector 11. The binary signal 66 is input to the zero-cross length detector 5.

The zero-cross length detector 5 continuously detects positions at which the binary signal 66 changes from "1" to "0" or from "0" to "1". Based on the reproduction clock signal 63, the zero-cross length detector 5 counts the number of samples between two adjacent zero-cross points, and holds the counted value in a register (not shown) as a zero-cross length. The maximum pattern length detector 7 and the minimum pattern length detector 8 respectively detect a maximum value and a minimum value of sums of two adjacent zero-cross lengths in a period which is set by the frame counter 6, and each holds the maximum value or the minimum value in a register (not shown). Thus, information which is in inverse proportion to the linear velocity period of the multiple bit digital signal 64 is obtained.

The cycle information determinator 9 compares the maximum pattern length and the minimum pattern length, and selects an optimum value as cycle information using the ratio of the maximum pattern length and the minimum pattern length (comparison result). The cycle information determinator 9 outputs the select signal 72 representing the optimum value to the frequency error detector 10. Based on the select signal 72, the frequency error detector 10 converts the difference between the cycle information and the maximum pattern length or the difference between the cycle information and the minimum pattern length into a frequency error, and determines a frequency error amount used for performing frequency control of the reproduction clock signal 63.

The synchronization pattern interval detector 11 acts as a determination section for determining whether or not the multiple bit digital signal 64 and the reproduction clock signal 63 are in synchronization with each other, based on the detection result of the pattern of the binary signal 66 obtained by the binary signal pattern detection section 50. The synchronization pattern interval detector 11 detects the positions of the synchronization patterns using the signal 68 representing the sum of two adjacent zero-cross lengths which is output by the zero-cross length detector 5, the synchronization determination flag 74 output from the maximum pattern length detector 7, and the signal 75 representing the synchronization pattern length which is output from cycle information determinator 9. The synchronization pattern interval detector 11 detects an interval between two adjacent synchronization patterns based on the detected positions of the synchronization patterns. When the interval is a prescribed value for a prescribed number of times in series, the synchronization pattern interval detector 11 determines that the multiple bit digital signal 64 and the reproduction clock signal 63 are in a synchronous state. Otherwise, the synchronization pattern interval detector 11 determines that the multiple bit digital signal 64 and the reproduction clock signal 63 are in an asynchronous state. The synchronization pattern interval detector 11 outputs a synchronization confirmation flag representing the determination result to the maximum likelihood decoder 4. Even after the multiple bit digital signal 64 and the reproduction clock signal 63 are placed into a synchronous state, the synchronization pattern interval detector 11 determines that the multiple bit digital signal 64 and the reproduction clock signal 63 are in an asynchronous state when the synchronization pattern interval is not the prescribed value for a plurality of times in series.

The phase information of the multiple bit digital signal 64 is detected by the phase error detector 12 using the multiple bit digital signal 65 which is obtained from the low frequency band noise suppression section 3, and thus a phase error amount is determined for performing phase synchronization control of the reproduction clock signal 63 and the multiple bit digital signal 64.

The frequency control loop filter 13 controls the frequency of the reproduction clock signal 63 until a state where the reproduction clock signal 63 can be considered to be synchronized with the multiple bit digital signal 64 is obtained. Such control is performed using the frequency error amount determined by the frequency error amount detector 10. The digital/analog converter 15 converts the digital signal 77 output from the frequency control loop filter 13 into the analog signal 79 and outputs the analog signal 79.

The phase control loop filter 14 uses the phase error amount determined by the phase error detector 12 to perform phase control such that the reproduction clock signal 63 is synchronized with the multiple bit digital signal 64. The digital/analog converter 16 converts the digital signal 78 output from the phase control loop filter 14 to the analog signal 80, and outputs the analog signal 80.

The analog signal 79 and the analog signal 80 are added together by the adder 52, and the oscillator 17 generates the reproduction clock signal 63 based on the addition result.

The above-described series of operations allow the frequency and phase of the reproduction clock signal 63 to be synchronized with the frequency and phase of the clock component of the multiple bit digital signal 64. Thus, the data recorded on the optical disc medium can be reproduced using the reproduction clock signal 63.

According to the first example of the present invention, a specific pattern length of the data reproduced from the optical disc medium (the length of the synchronization pattern P in FIG. 16B, i.e., the detected maximum pattern length) and the minimum pattern length are identified based on a combination of run-lengths of pulse trains which are output from the maximum likelihood decoder 4. The maximum likelihood decoder 4 uses different state transition rules whether the reproduction clock signal 63 and the multiple bit digital signal 64 are in a frequency and phase synchronous state or a frequency and phase asynchronous state.

Hereinafter, the frequency and phase control apparatus 100 according to the first example will be described in more detail.

The maximum likelihood decoder 4 will be described. In this example, a recording symbol has a minimum symbol length of 2T (T is a cycle corresponding to one bit of recording symbol included in the reproduction signal 61, and also is a cycle of the reproduction clock signal 63). The maximum likelihood decoder 4 uses a Viterbi algorithm with the premise of a PR (a, b, b, a) system. Here, "a" and "b" are arbitrary numerals.

Figure 12:
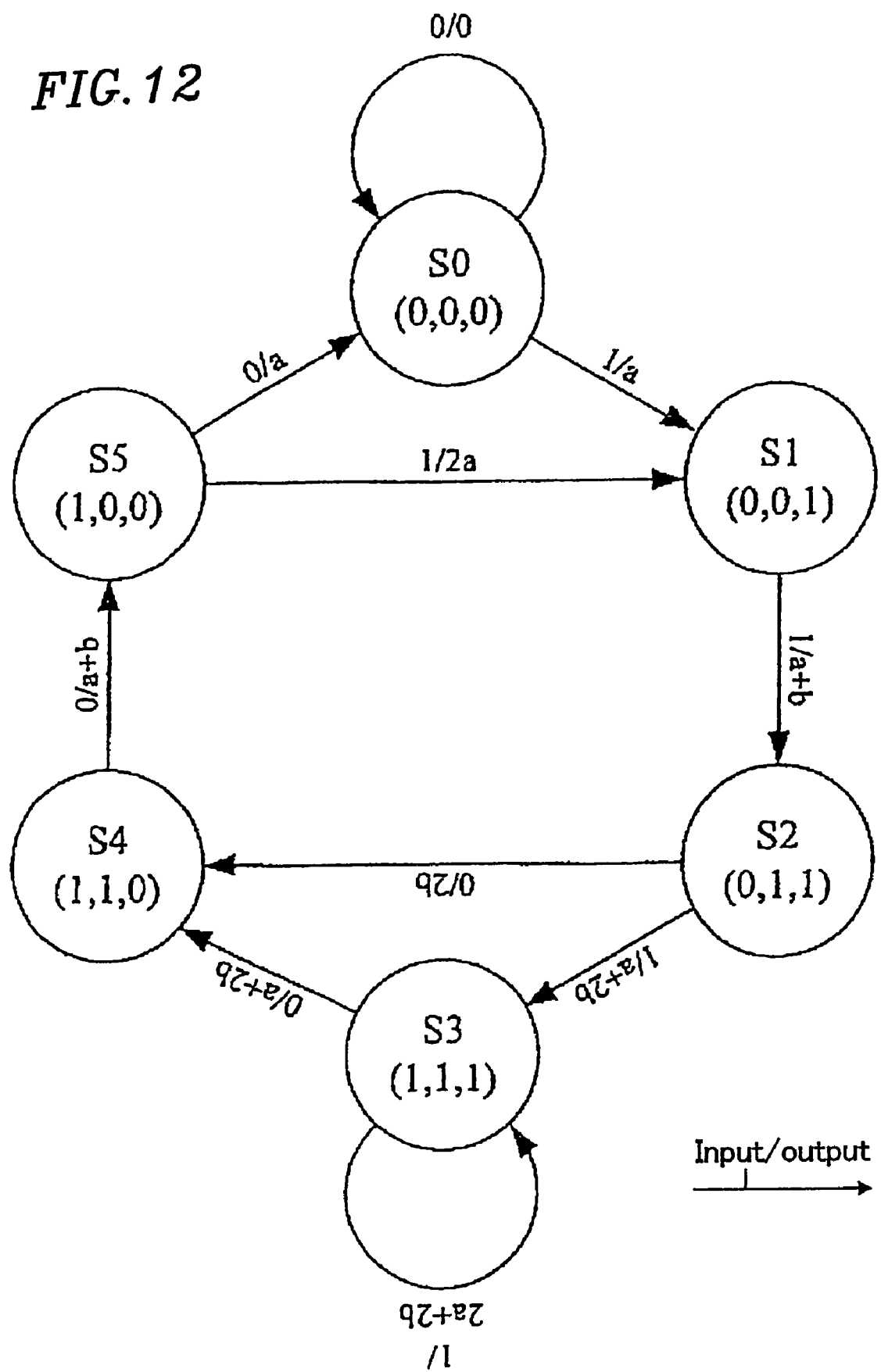
FIG. 12 shows a state transition based on a combination of a code word having a minimum symbol length of 2T and the PR (a, b, b, a) system according to one example of the present invention.

FIG. 12 shows a state transition which represents a first state transition rule used by the maximum likelihood decoder 4. The state transition shown in FIG. 12 has, as a premise, a combination of a recording symbol having a minimum inversion interval (minimum symbol length) of 2T and the PR (a, b, b, a) system. The minimum inversion interval is defined by a prescribed symbol rule. The number of states and the number of state transitions of the first state transition rule are restricted based on the minimum inversion interval. When a recording symbol having a minimum symbol length of 2T is used, the encoding string includes neither pattern "010" nor pattern "101". In this case, the first state transition rule is restricted to have 6 states and 10 paths. The signal levels calculated based on 6 states and 10 paths can be summarized in Table 1. In Table 1, "k" is an integer representing time, and the state at time k−1 is $S(b_{k-3}, b_{k-2}, b_{k-1})$.

TABLE 1

State transitions based on a combination of a recording symbol having a minimum inversion interval of 2T and the PR (a, b, b, a) system

| State at time k − 1 $S(b_{k-3}, b_{k-2}, b_{k-1})$ | Input at time k $b_k$ | Signal level |
|---|---|---|
| S(0, 0, 0) | 0 | 0 |
| S(0, 0, 0) | 1 | a |
| S(0, 0, 1) | 1 | a + b |
| S(0, 1, 1) | 0 | 2b |
| S(0, 1, 1) | 1 | a + 2b |
| S(1, 0, 0) | 0 | a |
| S(1, 0, 0) | 1 | 2a |
| S(1, 1, 0) | 0 | a + b |
| S(1, 1, 1) | 0 | a + 2b |
| S(1, 1, 1) | 1 | 2a + 2b |

As a result, there are 7 signal levels of "0", "a", "2a", "2b", "a+b", "a+2b", and "2a+2b". The values of the 7 signal levels are the threshold levels used when performing maximum likelihood decoding by the maximum likelihood decoder 4.

Figure 13:
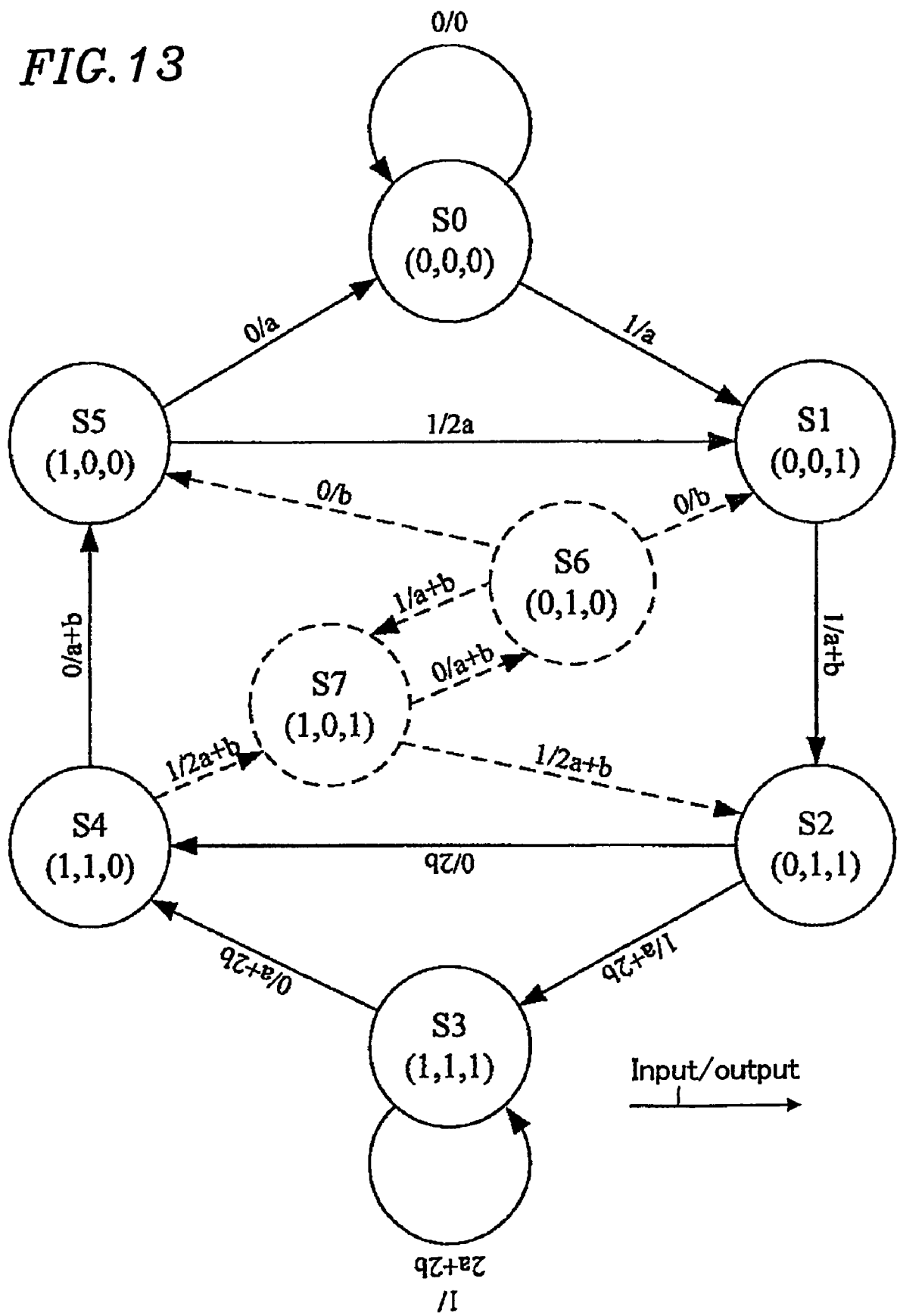
FIG. 13 shows a state transition based on a combination of a code word having a minimum symbol length of 1T and the PR (a, b, b, a) system according to one example of the present invention.

In an asynchronous state, a reproduction data string may include 1T, which cannot exist according to a prescribed symbol rule, as described in more detail below. For example, in the case where when the reproduction signal 62 is converted into the multiple bit digital signal 64 and the frequency of the reproduction clock signal 63 is lower than the frequency of the input reproduction signal (about half), 2T may be determined as 1T. In order to recognize the state in which the frequency of the reproduction clock signal 63 is lower than the frequency of the signal which is to be sampled, it is necessary to detect 1T. Therefore, in an asynchronous state, the maximum likelihood decoder 4 performs maximum likelihood decoding in accordance with a second state transition rule, by which there are 8 states and 16 paths. The second state transition rule is shown in FIG. 13. The state transition shown in FIG. 13 has, as a premise, a combination of a recording symbol having a minimum inversion interval of 1T and the PR (a, b, b, a) system. The number of states and the number of state transitions of the second state transition rule are restricted based on a minimum inversion interval of 1T, which is shorter than a minimum inversion interval of 2T defined by the prescribed symbol rule.

Whether the multiple bit digital signal 64 and the reproduction clock signal 63 are in a synchronous state or in an asynchronous state is determined by a synchronization confirmation flag which is output by the synchronization pattern interval detector 11. The signal levels calculated based on 8 states and 16 paths can be summarized in Table 2. In Table 2, "k" is an integer representing time, and the state at time k−1 is $S(b_{k-3}, b_{k-2}, b_{k-1})$.

TABLE 2

State transitions based on a combination of a recording symbol having a minimum inversion interval of 1T and the PR (a, b, b, a) system

| State at time k − 1 $S(b_{k-3}, b_{k-2}, b_{k-1})$ | Input at time k $b_k$ | Signal level |
|---|---|---|
| S(0, 0, 0) | 0 | 0 |
| S(0, 0, 0) | 1 | a |
| S(0, 0, 1) | 0 | b |
| S(0, 0, 1) | 1 | a + b |
| S(0, 1, 0) | 0 | b |
| S(0, 1, 0) | 1 | a + 2b |
| S(0, 1, 1) | 0 | 2b |

TABLE 2-continued

State transitions based on a combination of a recording symbol having a minimum inversion interval of 1T and the PR (a, b, b, a) system

| State at time k − 1 $S(b_{k-3}, b_{k-2}, b_{k-1})$ | Input at time k $b_k$ | Signal level |
|---|---|---|
| S(0, 1, 1) | 1 | a + 2b |
| S(1, 0, 0) | 0 | a |
| S(1, 0, 0) | 1 | 2a |
| S(1, 0, 1) | 0 | a + b |
| S(1, 0, 1) | 1 | 2a + b |
| S(1, 1, 0) | 0 | a + b |
| S(1, 1, 0) | 1 | 2a + b |
| S(1, 1, 1) | 0 | a + 2b |
| S(1, 1, 1) | 1 | 2a + 2b |

As a result, there are 9 signal levels of "0", "a", "b", "2a", "2b", "a+b", "2a+b", "a+2b" and "2a+2b". Hereinafter, the value of the 9 signal levels will be represented as di (i=0 through 8). The values of the 9 signal levels are the threshold levels used when performing maximum likelihood decoding by the maximum likelihood decoder 4.

Figure 14A:
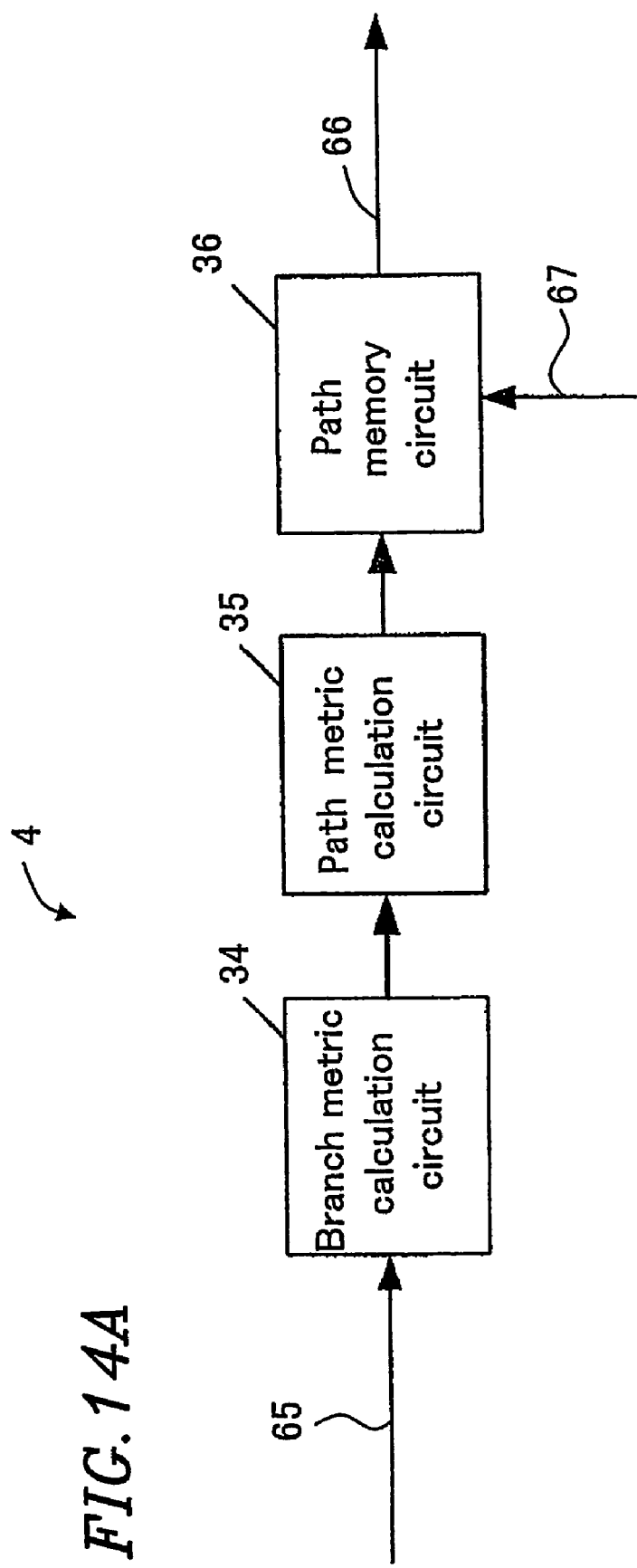
FIG. 14A is a block diagram of a maximum likelihood decoder according to one example of the present invention.

FIG. 14A is a block diagram illustrating a specific structure of the maximum likelihood decoder 4. The maximum likelihood decoder 4 includes a branch metric calculation circuit 34, a path metric calculation circuit 35, and a path memory circuit 36. The branch metric calculation circuit 34 calculates a branch metric of a multiple bit digital signal having a suppressed low frequency band noise component (which is input at every channel clock), and a branch metric (which is a square error of the 9 threshold levels di (i=0 through 8). Specifically, the branch metric calculation circuit 34 calculates branch metric $BM_k(i)$ represented by expression (1).

$$BM_k(i)=(y_k-di)^2 \qquad \text{expression (1)}$$

Here, $y_k$ is a reproduction digital signal having a suppressed low frequency band noise component, and di(i–0, 1, . . . , 8) are 9 threshold levels.

Next, the path metric calculation circuit 35 performs cumulative addition of branch metrics for every channel clock to calculate a path metric. Specifically, the path metric calculation circuit 35 calculates path metric $PM_k^{Si}$ represented by expression (2).

$$PM_k^{S0}=\min[PM_{k-1}^{S0}+BM_k(0), PM_{k-1}^{S5}+BM_k(1)]$$
$$PM_k^{S1}=\min[PM_{k-1}^{S0}+BM_k(1), PM_{k-1}^{S5}+BM_k(3)]$$
$$PM_k^{S6}=\min[PM_{k-1}^{S1}+BM_k(2), PM_{k-1}^{S7}+BM_k(5)]$$
$$PM_k^{S2}=\min[PM_{k-1}^{S1}+BM_k(5), PM_{k-1}^{S7}+BM_k(6)]$$
$$PM_k^{S3}=\min[PM_{k-1}^{S3}+BM_k(8), PM_{k-1}^{S2}+BM_k(7)]$$
$$PM_k^{S4}=\min[PM_{k-1}^{S3}+BM_k(7), PM_{k-1}^{S2}+BM_k(4)]$$
$$PM_k^{S7}=\min[PM_{k-1}^{S4}+BM_k(6), PM_{k-1}^{S6}+BM_k(5)]$$
$$PM_k^{S5}=\min[PM_{k-1}^{S4}+BM_k(5), PM_{k-1}^{S6}+BM_k(2)] \qquad \text{expression (2)}$$

In expression (2), "min" is a mathematical symbol. For example, "min[a, b] represents one of a and b, which is smaller (when a=b, min[a, b] represents either a or b).

The path metric calculation circuit 35 calculates selection signals [sel0, sel1, sel2, sel3, sel4, sel5, sel6, sel7] for selecting a data string in accordance with which the path metric is smallest, i.e., a data string which is most likely, based on the expressions (3) through (10), and outputs the results to the path memory circuit 36.

When $PM_{k-1}^{S0}+BM_k(0) \geq PM_{k-1}^{S5}+BM_k(1)$, Sel0=1
When $PM_{k-1}^{S0}+BM_k(0) < PM_{k-1}^{S5}+BM_k(1)$,
Sel0=0 \qquad expression (3)

When $PM_{k-1}^{S0}+BM_k(1) \geq PM_{k-1}^{S5}+BM_k(3)$,
Sel1=1 When $PM_{k-1}^{S0}+BM_k(1) < PM_{k-1}^{S5}+BM_k(3)$,
Sel1=0 \qquad expression (4)

When $PM_{k-1}^{S1}+BM_k(2) \geq PM_{k-1}^{S7}+BM_k(5)$,
Sel2=1 When $PM_{k-1}^{S1}+BM_k(2) < PM_{k-1}^{S7}+BM_k(5)$,
Sel2=0 \qquad expression (5)

When $PM_{k-1}^{S1}+BM_k(5) \geq PM_{k-1}^{S7}+BM_k(6)$,
Sel3=1 When $PM_{k-1}^{S1}+BM_k(5) < PM_{k-1}^{S7}+BM_k(6)$,
Sel3=0 \qquad expression (6)

When $PM_{k-1}^{S3}+BM_k(8) \geq PM_{k-1}^{S2}+BM_k(7)$,
Sel4=1 When $PM_{k-1}^{S3}+BM_k(8) < PM_{k-1}^{S2}+BM_k(7)$,
Sel4=0 \qquad expression (7)

When $PM_{k-1}^{S3}+BM_k(7) \geq PM_{k-1}^{S2}+BM_k(4)$,
Sel5=1 When $PM_{k-1}^{S3}+BM_k(7) < PM_{k-1}^{S2}+BM_k(4)$,
Sel5=0 \qquad expression (8)

When $PM_{k-1}^{S4}+BM_k(6) \geq PM_{k-1}^{S6}+BM_k(5)$,
Sel6=1 When $PM_{k-1}^{S4}+BM_k(6) < PM_{k-1}^{S6}+BM_k(5)$,
Sel6=0 \qquad expression (9)

When $PM_{k-1}^{S4}+BM_k(5) \geq PM_{k-1}^{S6}+BM_k(2)$,
Sel7=1 When $PM_{k-1}^{S4}+BM_k(5) < PM_{k-1}^{S6}+BM_k(2)$,
Sel7=0 \qquad expression (10)

Figure 14B:
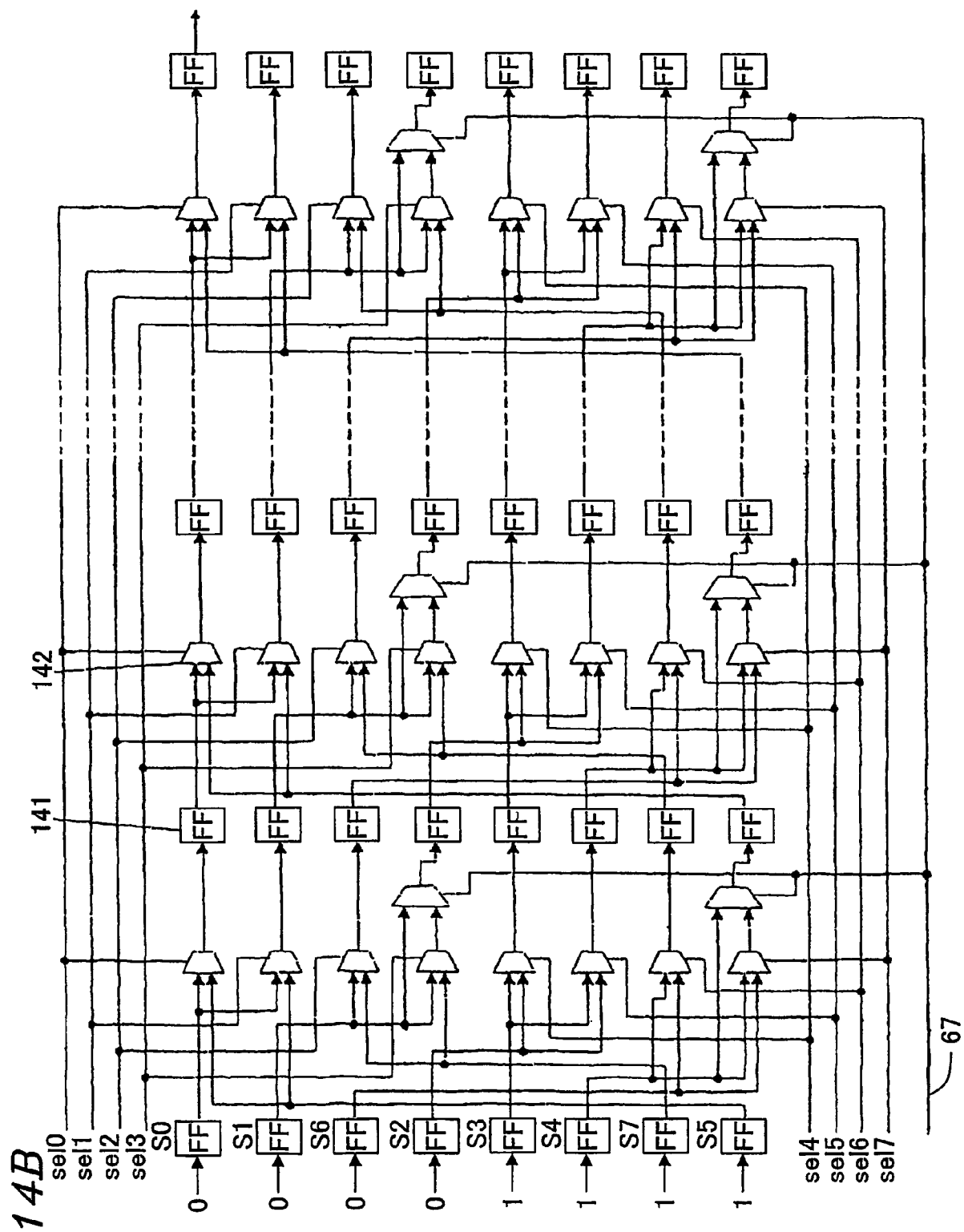
FIG. 14B is a block diagram of a path memory circuit according to one example of the present invention.

FIG. 14B is an exemplary circuit structure of the path memory circuit 36. The path memory circuit 36 includes a plurality of flip-flop circuits 141 and a plurality of selectors 142. The path memory circuit 36 stores prescribed candidate strings, and selects the most likely data string in accordance with the selection signals [sel0, sel1, sel2, sel3, sel4, sel5, sel6, sel7] received from the path metric calculation circuit 35. Then, the path memory circuit 36 holds the selected data string in a memory (register) not shown. Finally, the path memory circuit 36 outputs a binary signal representing "1" or "0".

In the case where the synchronization confirmation flag 67 output from the synchronization pattern interval detector 11 shows a synchronous state, the states and paths represented by dotted lines in FIG. 13 are deleted. Decoding is performed in accordance with the first state transition rule shown in FIG. 12. Namely, the path metric calculation circuit 35 deletes the states and paths represented by dotted lines in FIG. 13 from expression (2) and calculates the path metric $PM_k^{Si}$ represented by expression (11).

$$PM_k^{S0}=\min[PM_{k-1}^{S0}+BM_k(0), PM_{k-1}^{S5}+BM_k(1)]$$
$$PM_k^{S1}=\min[PM_{k-1}^{S0}+BM_k(1), PM_{k-1}^{S5}+BM_k(3)]$$
$$PM_k^{S2}=PM_{k-1}^{S1}+BM_k(5) \quad PM_k^{S3}=\min[PM_{k-1}^{S3}+BM_k(8), PM_{k-1}^{S2}+BM_k(7)] PM_k^{S4}=\min[PM_{k-1}^{S3}+BM_k(7), PM_{k-1}^{S2}+BM_k(4)] PM_k^{S5}=PM_{k-1}^{S4}+BM_k(5) \qquad \text{expression (11)}$$

The path metric calculation circuit 35 calculates only selection signals [sel0, sel1, sel4, sel5] corresponding to expression (11), among signals for selecting the most likely data string by which the path metrics in expressions (3) through (10) are minimum. Then, the path metric calculation circuit 35 outputs the selection signals [sel0, sel1, sel4, sel5] to the path memory circuit 36. The path memory circuit 36 stores prescribed candidate strings, and selects the most likely data string in accordance with the selection signals [sel0, sel1, sel4, sel5] received from the path metric calculation circuit 35. Then, the path memory circuit 36 holds the selected data string in a memory (register) not shown. Finally, the path memory circuit 36 outputs a binary signal representing "1" or "0". When the memory length of the path memory circuit 36 for storing data strings is increased, the probability at which an accurate value is selected is higher; but when the memory length is too long, the circuit scale is excessively enlarged. Thus, the probability of an accurate value being detected and the circuit scale have a trade-off relationship. Which one of the performance and the circuit scale is to be given the higher priority is determined case by case.

Figure 2:
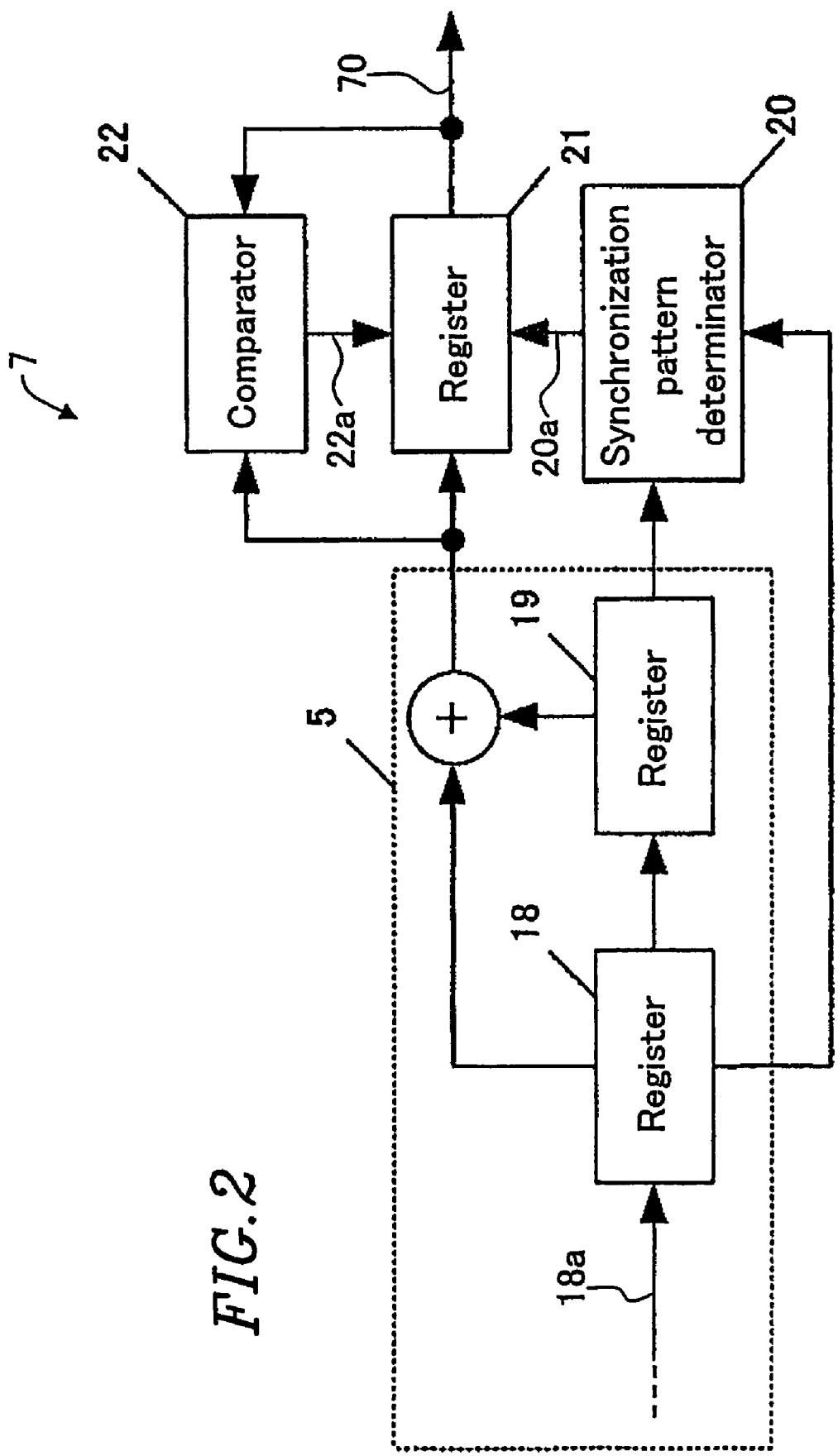
FIG. 2 is a block diagram illustrating a maximum pattern detector according to one example of the present invention.

FIG. 2 shows the maximum pattern length detector 7. The maximum pattern length detector 7 includes a synchronization pattern determinator 20, a comparator 22, and a register 21. The zero-cross length detector 5 connected to the maximum pattern length detector 7 includes registers 18 and 19. The zero-cross length detector 5 holds a zero-cross length (counted value 18a) in the registers 18 and 19. The synchronization pattern determinator 20 compares the counted values held in the registers 18 and 19, and determines whether or not the detected pattern is a synchronization pattern. The comparator 22 compares a sum of the counted values held in the registers 18 and 19 with a value registered so far in the register 21. These counted values and the sum are included in the signal 68.

Only when the synchronization pattern determinator 20 determines that the detected pattern is a synchronization pattern and further the comparator 22 determines that the new value is larger than the previous value, the synchronization pattern determinator 20 and the comparator 22 output update permission signals 20a and 22a to the register 21 to update the register 21.

Figure 7A:
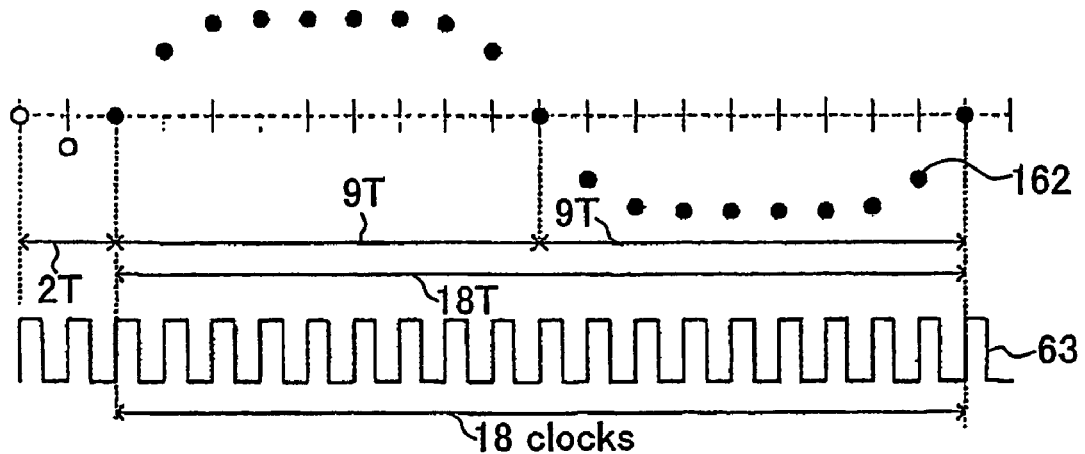
FIGS. 7A, 7B and 7C show a principle for detecting a frequency error signal according to one example of the present invention.
Figure 7B:
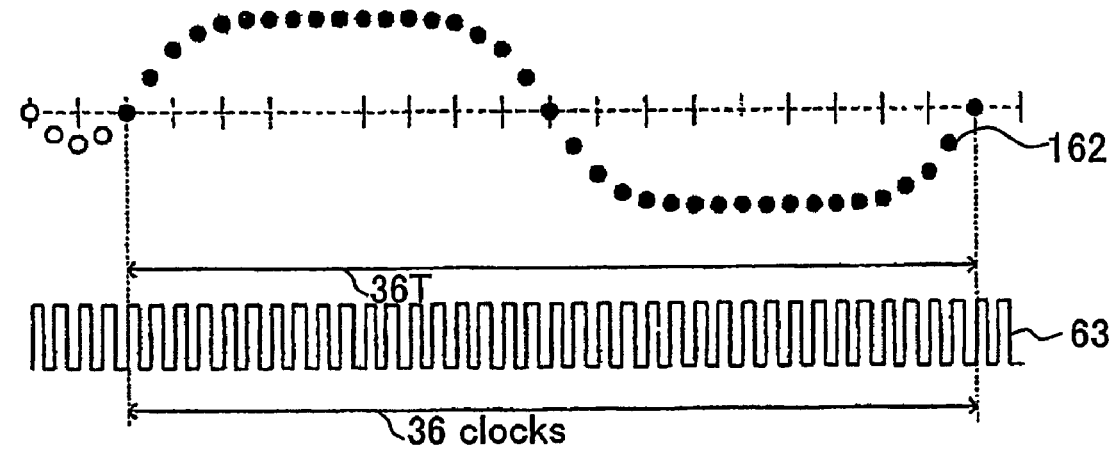
Figure 7C:
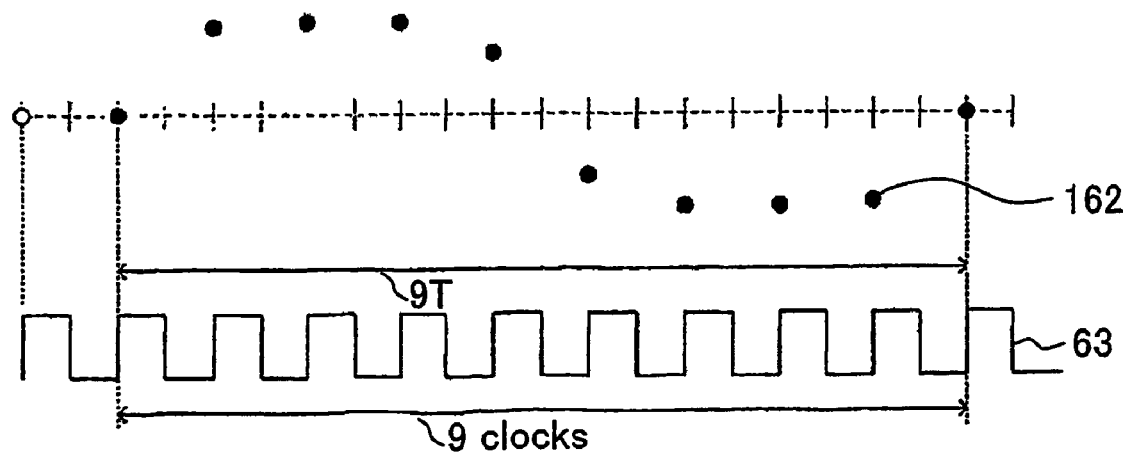

For example, a data string recorded in the next generation optical disc medium mentioned above includes a continuous pattern of 9T9T synchronization patterns. The synchronization pattern length is 9T+9T=18T as shown in FIG. 7A when counted based on the reproduction clock signal 63 (which is in synchronization with the clock component of the multiple bit digital data 64), i.e., when the frequency of the reproduction clock signal 63 is equal to the frequency of the reproduction clock signal 63 at the time of synchronization. When the reproduction clock signal 63 is oscillated at a frequency twice as high as the frequency of the clock component of the multiple bit digital data 64 (i.e., when the frequency of the reproduction clock signal 63 is twice as high as the frequency of the reproduction clock signal 63 at the time of synchronization), the synchronization pattern length is 18T+18T=36T as shown in FIG. 7B. When the reproduction clock signal 63 is oscillated at half the frequency of the clock component of the multiple bit digital data 64 (i.e., when the frequency of the reproduction clock signal 63 is ½ of the frequency of the reproduction clock signal 63 at the time of synchronization), the synchronization pattern length is 4.5T+4.5T=9T as shown in FIG. 7C. (In actuality, the synchronous pattern length cannot be counted as 4.5T, and thus is 5T+4T or 4T+5T.) Thus, when the multiple bit digital signal 64 and the reproduction clock signal 63 are not in synchronization with each other, the pattern of 18T is not detected. The difference between the detected synchronization pattern length and 18T is cycle information.

Basically, two adjacent values have the ratio of 1:1 regardless of the frequency of the reproduction clock signal 63. Considering the detection variance, the synchronization pattern determinator 20 finds a synchronization pattern from the reproduction signal by determining that a synchronization pattern exists as long as the value of the register 19 is within ±1 of the value of the register 18.

Figure 3:
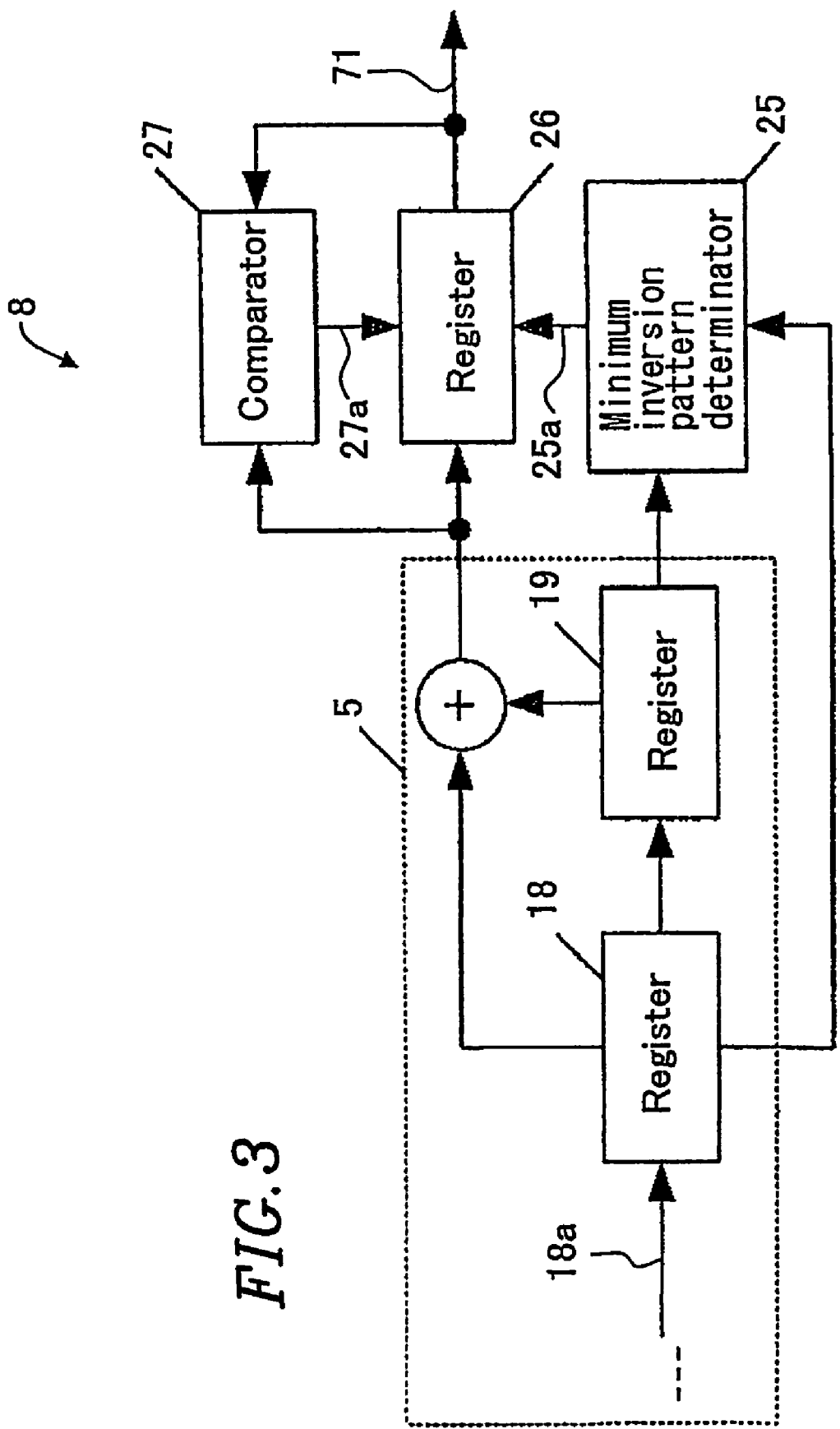
FIG. 3 is a block diagram illustrating a minimum pattern detector according to one example of the present invention.

FIG. 3 shows the minimum pattern detector 8. The minimum pattern detector 8 includes a minimum inversion pattern determinator 25, a register 26, and a comparator 27. The minimum inversion pattern determinator 25 compares the counted values held in the registers 18 and 19, and determines whether or not the detected pattern is a minimum inversion pattern. The comparator 27 compares a sum of the counted values held in the registers 18 and 19 with a value registered so far in the register 26.

Only when the minimum pattern determinator 25 determines that the detected pattern is a minimum pattern and further the comparator 27 determines that the new value is smaller than the previous value, the synchronization pattern determinator 25 and the comparator 27 output update permission signals 25a and 27a to the register 26 to update the register 26.

Figure 8A:
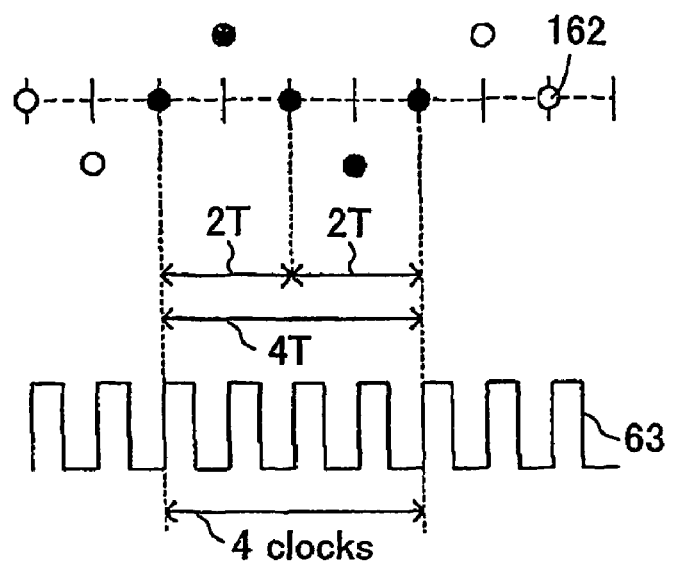
FIGS. 8A, 8B and 8C show a principle for detecting a frequency error signal according to one example of the present invention.
Figure 8B:
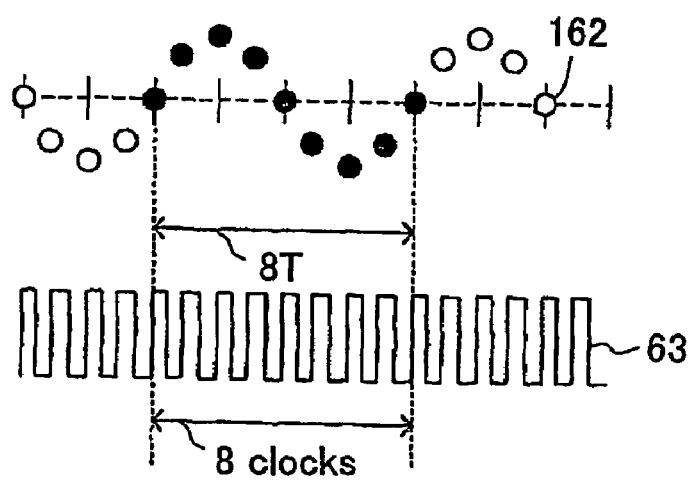
Figure 8C:
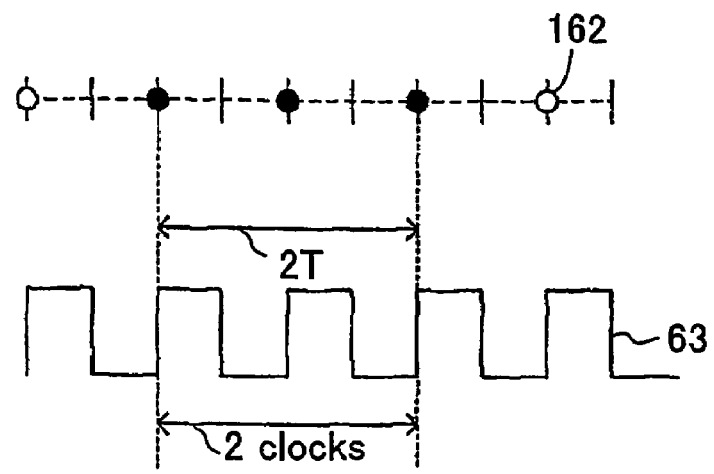

For example, a data string recorded in the next generation optical disc medium mentioned above includes a 2T2T minimum inversion pattern. The minimum inversion pattern length is 2T+2T=4T as shown in FIG. 8A when counted based on the reproduction clock signal 63 (which is in synchronization with the clock component of the multiple bit digital data 64), i.e., when the frequency of the reproduction clock signal is equal to the frequency of reproduction clock signal 63 at the time of synchronization. When the reproduction clock signal 63 is oscillated at a frequency twice as high as the frequency of the clock component of the multiple bit digital data 64 (i.e., when the frequency of the reproduction clock signal 63 is twice as high as the frequency of the reproduction clock signal 63 at the time of synchronization), the minimum inversion pattern length is 4T+4T=8T as shown in FIG. 8B. When the reproduction clock signal 63 is oscillated at half the frequency of the clock component of the multiple bit digital data 64 (i.e., when the frequency of the reproduction clock signal 63 is ½ of the frequency of the reproduction clock signal 63 at the time of synchronization), the minimum inversion pattern length is 1T+1T=2T as shown in FIG. 8C. Thus, when the multiple bit digital signal 64 and the reproduction clock signal 63 are not in synchronization with each other, the pattern of 4T is not detected. The difference between the detected synchronization pattern length and 4T is cycle information.

As in the case of the synchronization pattern, two adjacent values basically have the ratio of 1:1 regardless of the frequency of the reproduction clock signal 63. Considering the detection variance, the minimum inversion pattern determinator 25 finds a minimum inversion pattern from the reproduction signal by determining that a minimum inversion pattern exists as long as the value of the register 19 is within ±1 of the value of the register 18.

Thus, the maximum pattern length detector 7 and the minimum pattern length detector 8 together allow a synchronization pattern and a minimum inversion pattern to be stably detected without relying on a change in the frequency of the reproduction clock signal 63.

Figure 4:
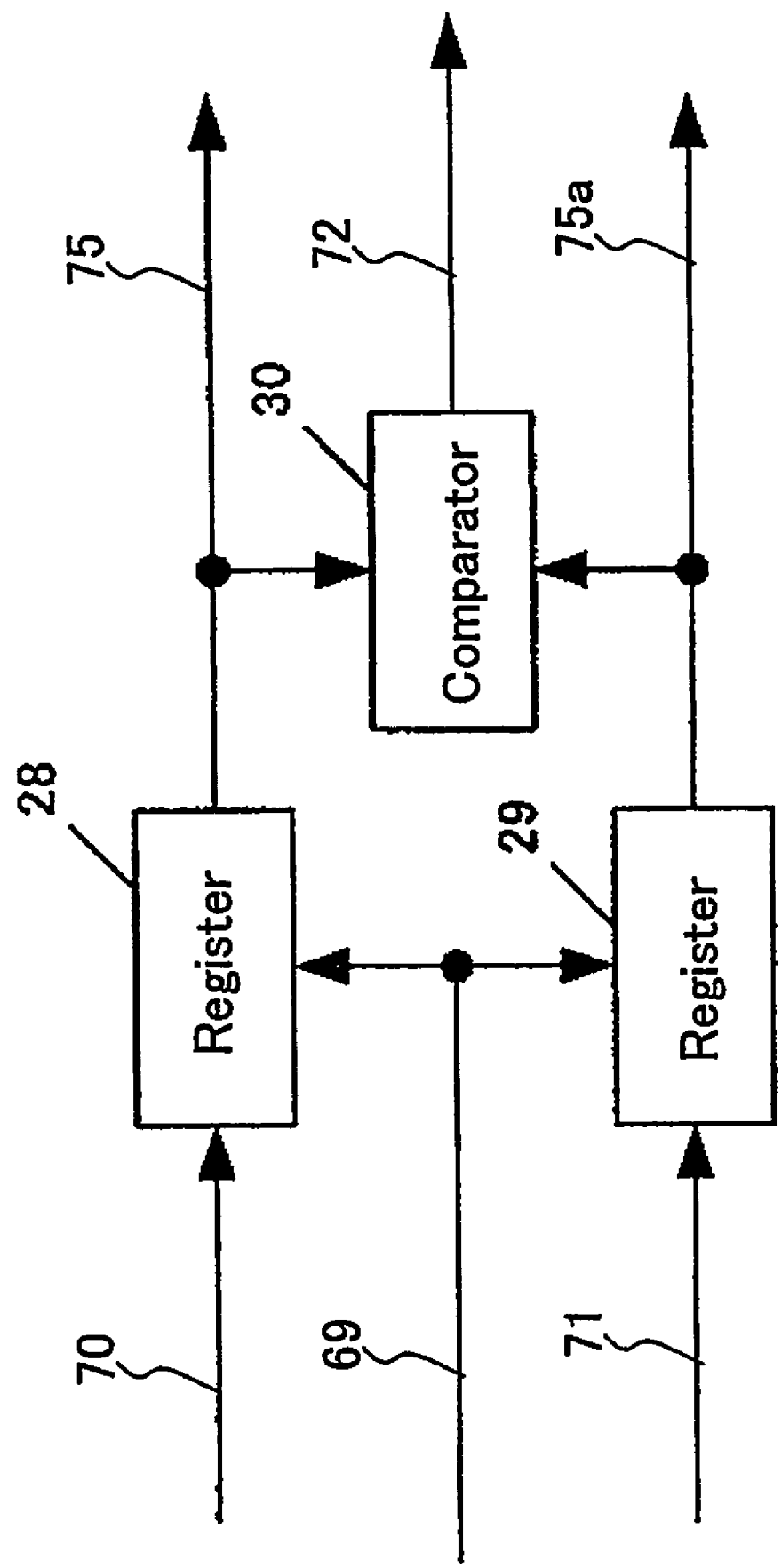
FIG. 4 is a block diagram illustrating a cycle information determinator according to one example of the present invention.

FIG. 4 shows the cycle information determinator 9. The cycle information determinator 9 includes a register 28, a register 29, and a comparator 30. The register 28 holds a maximum value of the synchronization pattern length in a period which is set by a frame flag included in the signal 69 output from the frame counter 6. The register 29 holds a minimum value of the minimum inversion pattern length. Based on the value held by the register 28 and the value held by the register 29, the comparator 30 generates the select signal 72 for selecting cycle information which appears to be optimum.

For example, in the next generation optical disc mentioned above, the synchronization pattern is 9T+9T=18T, and the minimum inversion pattern is 2T+2T=4T. Even when the frequency of the reproduction clock signal 63 is changed, the ratio of the two, i.e., 9:2 is maintained. Accordingly, when the value of the register 28 minus two least significant bits, i.e., ¼ of the original value, is within ±1 of the value of the register 29, a select signal is output such that the synchronization pattern length, which can be detected with high precision, is used as cycle information. Otherwise, a select signal is output such that the minimum inversion pattern length, which can be detected with high precision, is used as cycle information.

Thus, the detection result can be used for efficient control, and therefore the frequency control can be controlled at high speed. For a seek operation as well as for reproduction, when it is difficult to detect a synchronization pattern, the minimum inversion pattern is detected with priority and used for control. Therefore, frequency control can be performed. The signal 75 representing the synchronization pattern length and the signal 75a representing the minimum inversion pattern length are output to the frequency error detector 10.

Figure 5:
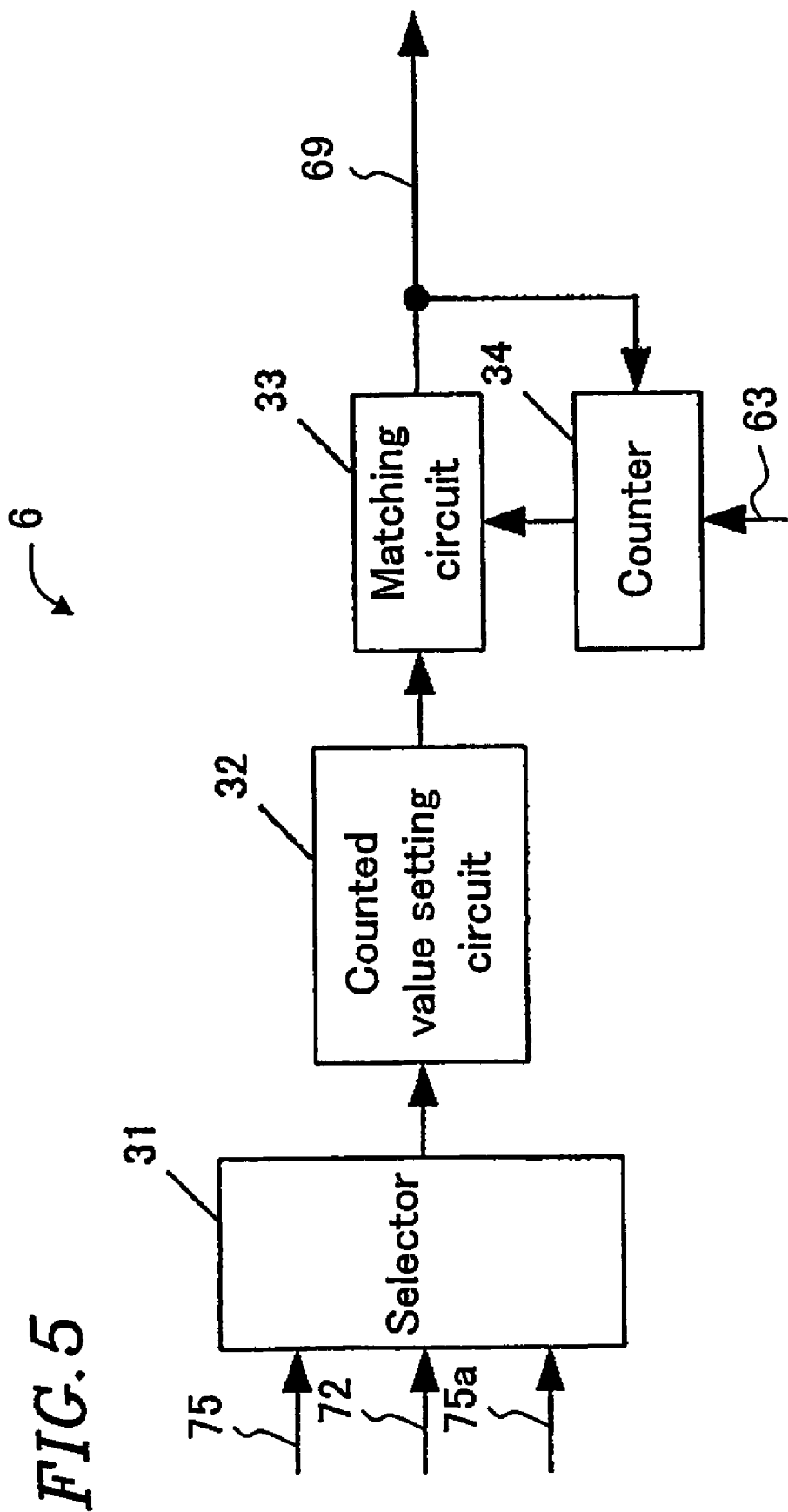
FIG. 5 is a block diagram illustrating a frame counter according to one example of the present invention.

FIG. 5 shows the frame counter 6. The frame counter 6 includes a selector 31, a counted value setting circuit 32, a matching circuit 33 and a counter 34. The selector 31 receives the signals 72, 75 and 75a output from the cycle information determinator 9 shown in FIG. 4, and selects one of the signals 72, 75 and 75a based on the select signal 72. The counted value setting circuit 32 determines the next counted value based on the signal selected by the selector 31. When the output from the counted value setting circuit 32 and the output from the counter 34 for performing counting based on the reproduction clock signal 63 match each other, the matching circuit 33 outputs the signal 69 including a frame flag. The counter 34 is reset by the frame flag which is output from the matching circuit 33.

Figure 9A:
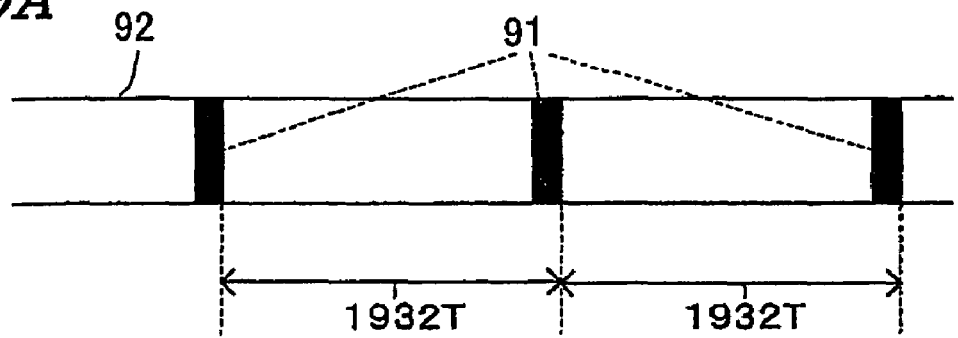
FIGS. 9A, 9B and 9C show a principle for detecting a frame interval according to one example of the present invention.
Figure 9B:
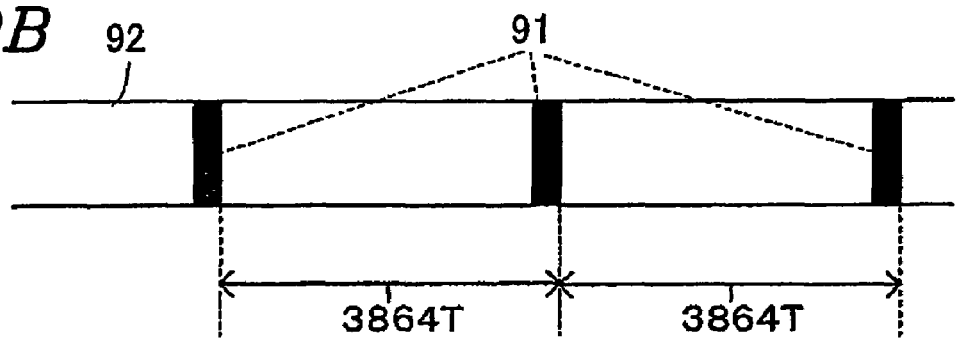
Figure 9C:
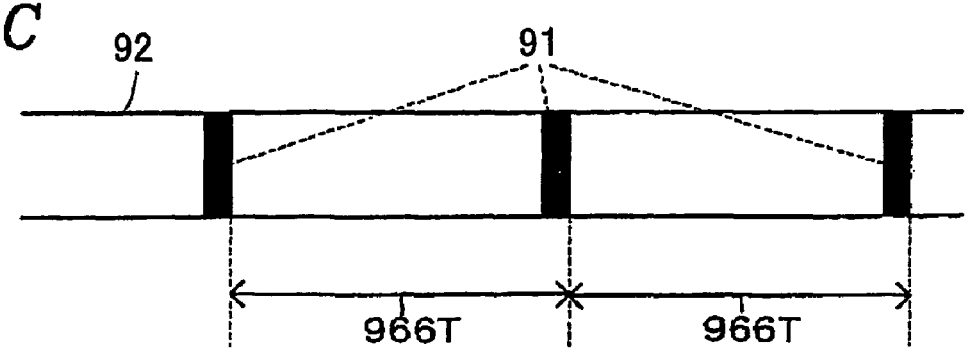

For example, in the next generation optical disc mentioned above, as shown in FIG. 9A, synchronization patterns 91 exist in reproduction data 92 equidistantly at a ratio of one per counted value 1932T. When detecting an interval between the synchronization patterns based on the reproduction clock signal 63, the interval between the synchronization patterns varies in accordance with the deviation between the frequency of the reproduction clock signal 63 and the frequency of the clock component of the multiple bit digital signal 64. When the frequency of the reproduction clock signal 63 is ½ of the frequency of the clock component of the multiple bit digital data 64 (i.e., when the frequency of the reproduction clock signal 63 is ½ of the frequency of the reproduction clock signal 63 at the time of phase synchronization), the interval between the synchronization patterns is detected as being counted value 966T based on the reproduction clock signal 63 as shown in FIG. 9C. When the frequency of the reproduction clock signal 63 is twice as high as the frequency of the clock component of the multiple bit digital data 64 (i.e., when the frequency of the reproduction clock signal 63 is twice as high as the frequency of the reproduction clock signal 63 at the time of phase synchronization), the interval between the synchronization patterns is detected as being counted value 3864T based on the reproduction clock signal 63 as shown in FIG. 9B.

While the frequency of the reproduction clock signal 63 is being controlled, the detecting interval of the synchronization patterns varies in accordance with time. However, even when the frequency of the reproduction clock signal 63 is changed, the ratio of the synchronization pattern interval and the synchronization pattern length is 1932/18 with no change, and the ratio of the synchronization pattern interval and the minimum inversion pattern length is 1932/4. Therefore, when the synchronization pattern length is selected by the selector 31 as cycle information, the counted value setting circuit 32 can increase the output signal from the selector 31 by 8 bits (can multiply the original value by 256). In this way, the detecting period of the cycle information can be about 2.4 frames ("frame" is a data unit which is delimited by a synchronization pattern). When the minimum inversion pattern length is selected by the selector 31 as cycle information, the counted value setting circuit 32 can increase the output signal from the selector 31 by 9 bits (can multiply the original value by 512).

In this way, the detecting period of the cycle information can be about 1 frame. The counted value can be manipulated by changing the number of bits to be manipulated by the counted value setting circuit 32.

These functions of the frame counter 6 allow the detecting period of cycle information to be optimized based on the condition that at least one synchronization pattern is included in the detecting period of the synchronization information. Thus, the frequency of the reproduction clock signal 63 can be synchronized at increased speed. Unless a synchronization pattern is included in one period for detecting cycle information, the frequency error cannot be obtained from the synchronization pattern length. Therefore, the one period needs to include at least one synchronization pattern. If the one period for detecting cycle information is fixed, then no synchronization pattern exists or more than necessary number of synchronization pattern exist the period, depending on the amount of frequency deviation. In this case, the detecting precision and the detecting efficiency of the synchronization pattern are lowered, which slows the feedback in frequency control. As a result, the synchronization takes more time.

The frequency error detector 10 generates a frequency error amount according to the following principle.

For example, a data string recorded in the next generation optical disc medium mentioned above includes both a 9T9T synchronization pattern and a 2T2T minimum inversion pattern. The synchronization pattern length and the minimum inversion pattern length are respectively 18T and 4T as shown in FIGS. 7A and 8A when counted based on the reproduction clock signal 63 (which is in synchronization with the clock component of the multiple bit digital data 64). When the reproduction clock signal 63 is oscillated at a frequency twice as high as the frequency of the clock component of the multiple bit digital data 64, the synchronization pattern length and the minimum inversion length are respectively 36T and 8T as shown in FIGS. 7B and 8B. When the reproduction clock signal 63 is oscillated at half the frequency of the clock component of the multiple bit digital data 64, the synchronization pattern length and the minimum inversion length are respectively 9T and 2T as shown in FIGS. 7C and 8C. Thus, when the multiple bit digital signal 64 and the reproduction clock signal 63 are not in synchronization with each other, neither the pattern of 18T nor the minimum inversion length of 4T are detected. The detected synchronization pattern length minus 18T, or the detected minimum inversion pattern length minus 4T, is the value of the frequency error signal. Which value is to be used is determined by the cycle information detector 9.

Figure 10:
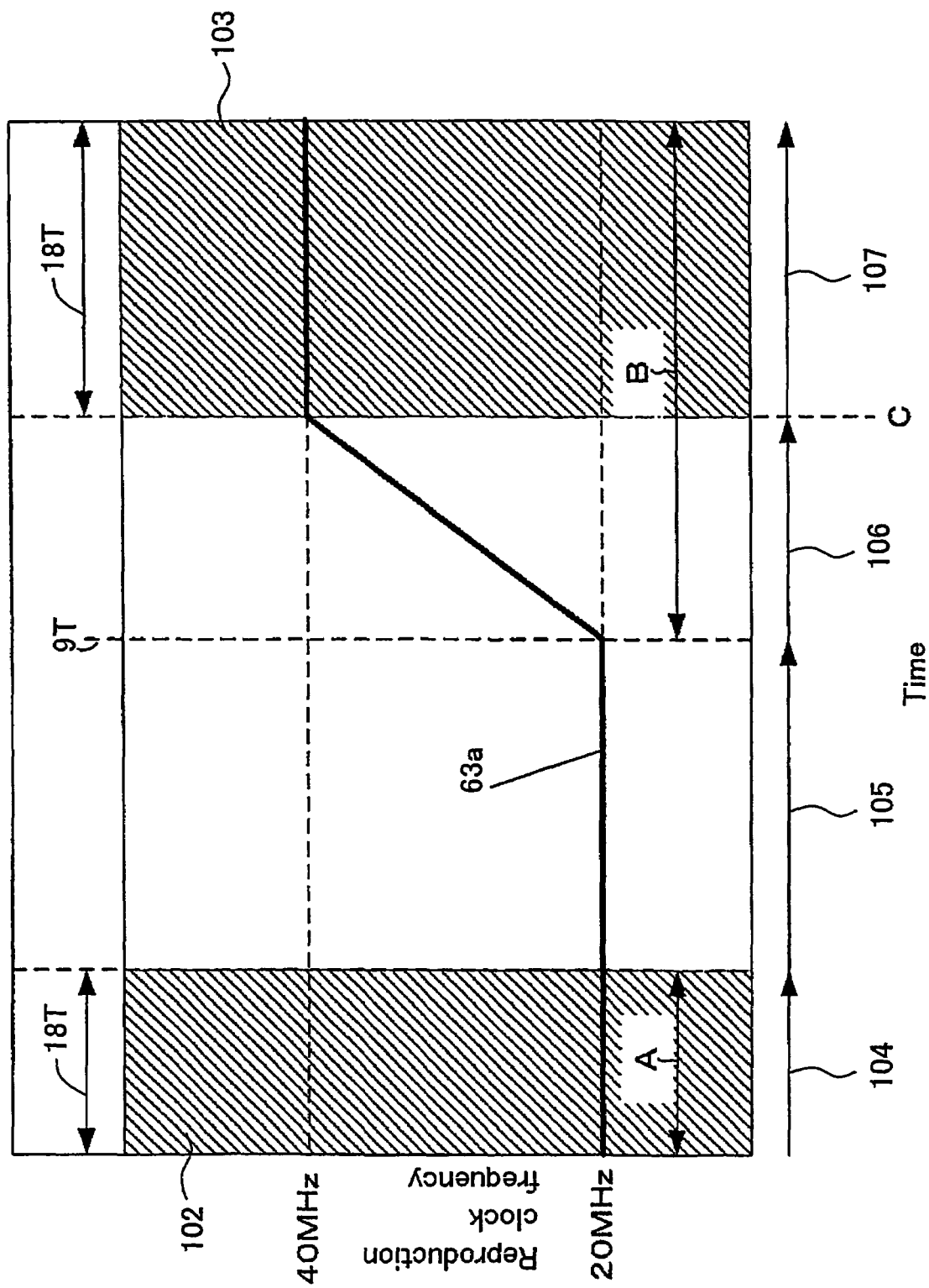
FIG. 10 shows frequency control and phase control during CVA reproduction according to one example of the present invention.

For example, in CAV reproduction in which reproduction is performed with the rotation rate of the motor for rotating a recording medium being set to be constant, the linear velocity of the reproduction data changes from an inner area to an outer area of the recording medium. With reference to FIG. 10, it is assumed, for example, that the frequency in synchronization with the frequency of the reproduction data is 20 MHz in position A in an inner area of the medium and is 40 MHz at position B in an outer area of the medium, and that the reproduction clock signal 63 output from the oscillator 17 is in synchronization with the clock component of the reproduction data (multiple bit digital signal 64) at position A. Hatched areas 102 and 103 each represent a readable area. It is assumed that a reading element of a reproduction apparatus finishes reproducing data at position A (period 104) and then seeks to position B. Immediately after the start of the seek operation (period 105), a frequency 63a of the reproduction clock signal 63 is 20 MHz. In this state, the frequency 63a of the reproduction clock signal 63 is half the frequency of the clock component of the reproduction data 64). Therefore, at position B, the synchronization pattern length is 9T when counted based on the reproduction clock signal 63, which is half of 18T detected at the time of synchronization. Similarly, the minimum inversion pattern length detected at position B is 2T, which is half of 4T detected at the time of synchronization. Since the synchronization pattern length and the minimum inversion pattern length fulfill the ratio of 9:2, the cycle information determinator 9 determines that the synchronization pattern length is a reliable value. Then, the frequency error detector 10 outputs a frequency error signal representing 9T-18T=-9T (the detected synchronization pattern length minus the synchronization pattern length at the time of phase synchronization). Since the obtained frequency error signal has a negative value, the frequency 63a of the reproduction clock signal 63 is determined to be lower than the frequency of the clock component included in the reproduction data. Therefore, the feedback acts in the direction of increasing the frequency 63a of the reproduction clock signal 63 output from the oscillator 17 via the frequency control loop filter 13 and the digital/analog converter 15 (period 106), and the synchronization pattern length of 18T is detected at position C in FIG. 10. Thus, frequency control is completed. When the frequency control is completed, phase synchronization is started, and the phase of the reproduction clock signal 63 and the phase of the reproduction data can be synchronized (period 107). The time required for post-seek operation phase synchronization can be shortened by feeding back the frequency error amount during a seek operation.

Figure 6:
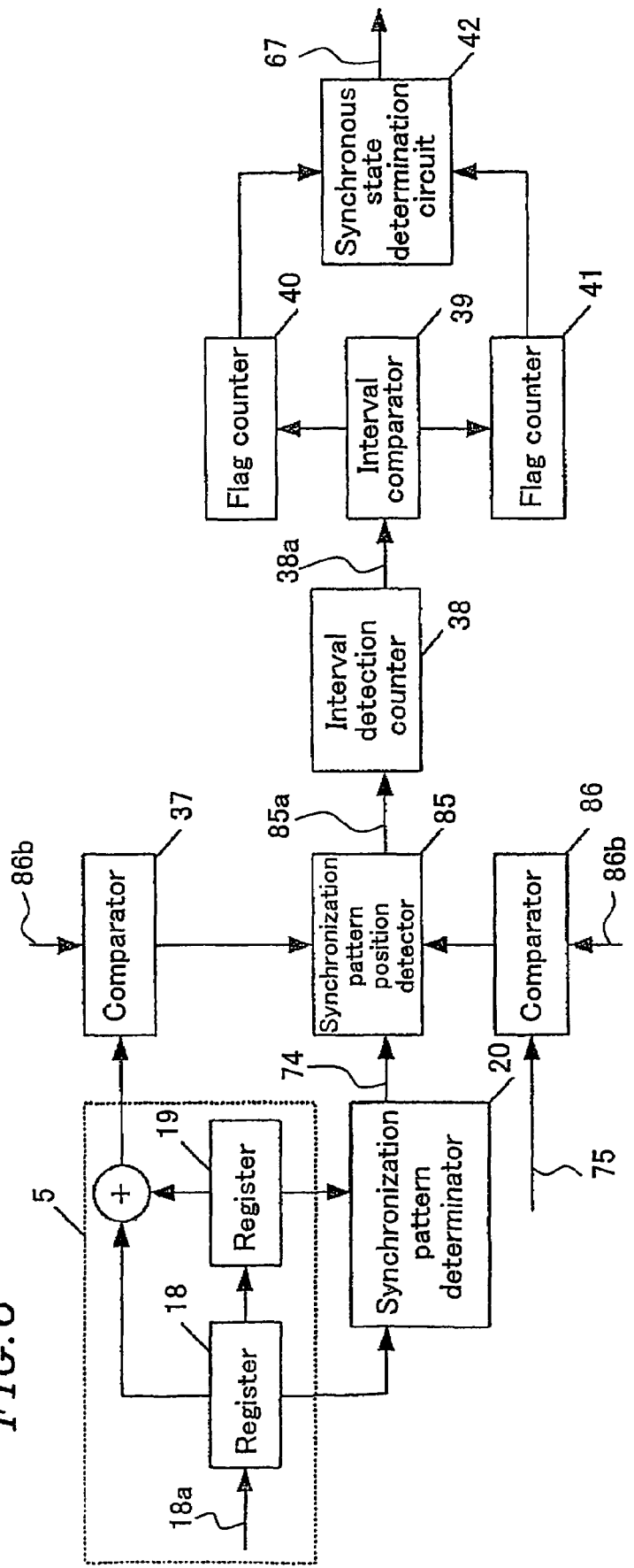
FIG. 6 is a block diagram illustrating a synchronization pattern interval detector according to one example of the present invention.

FIG. 6 shows the synchronization pattern interval detector 11. The synchronization pattern interval detector 11 includes a synchronization pattern position detector 85, a comparator 86, a comparator 37, an interval detection counter 38, an interval comparator 39, flag counters 40 and 41, and a synchronous state determination circuit 42.

The comparator 86 compares a signal 75 representing the synchronization pattern length and a defined value 86b of the synchronization pattern length, and outputs the comparison result. The comparator 37 compares a sum of the output from the register 18 and the output from the register 19 with the defined value 86b of the synchronization pattern, and outputs the comparison result. The synchronization pattern position detector 85 detects a position of the synchronization pattern using the synchronization determination flag 74, the output from the comparator 86, and the output from the comparator 37, and outputs a synchronization pattern flag 85a. The interval detection counter 38 counts the interval between synchronization pattern flags 85a, and outputs a signal 38a representing the detected synchronization pattern interval for each synchronization pattern flag 85a. Simultaneously, the interval detection counter 38 is reset and initialized. The interval comparator 39 determines whether or not the synchronization pattern interval fulfills a prescribed condition. When the prescribed condition is fulfilled, the flag counter 40 is counted up. When not, the flag counter 41 is counted up. The flag counters 40 and 41 are reset in opposite conditions to each other. The counted value of the flag counters 40 and 41 each represent a number of times that the same synchronization pattern intervals are continued. When such a number of times matches a prescribed value held by an external register, the synchronization state determination circuit 42 determines a control state in accordance with a prescribed rule, and outputs a synchronization confirmation flag which represents whether the multiple bit digital signal 64 and the reproduction clock signal 63 are in a frequency and phase synchronous state or in a frequency and phase asynchronous state. In response to this, the control state of the maximum likelihood decoder 4 is automatically switched.

For example, in the next generation optical disc mentioned above, when the reproduction clock signal 63 is in synchronization with the multiple bit digital data 64, the synchronization pattern position detector 85 detects a synchronization pattern flag every 1932 counts and the synchronization interval counter 38 outputs the counted value of the synchronization pattern interval, i.e., 1932, as long as the frequency and phase control apparatus 100 operates normally. Even in consideration of detection failure, the synchronization pattern should be detected a plurality of times in series in a frequency and phase synchronous state. When the synchronization pattern cannot be detected for a prescribed number of times in series, i.e., the flag counter 41 is continuously counted up to a prescribed counted value, the frequency and phase control apparatus 100 is regarded as in an abnormal state and re-synchronization of frequency and phase is performed. Owing to such a function, the frequency and phase control apparatus 100 can identify an abnormal state of control. When it is determined that the frequency and phase control apparatus 100 is in an abnormal state, the frequency and phase control apparatus 100 performs a self recovery operation. Therefore, the frequency and phase control apparatus 100 can recover in a reduced time period.

Figure 11A:
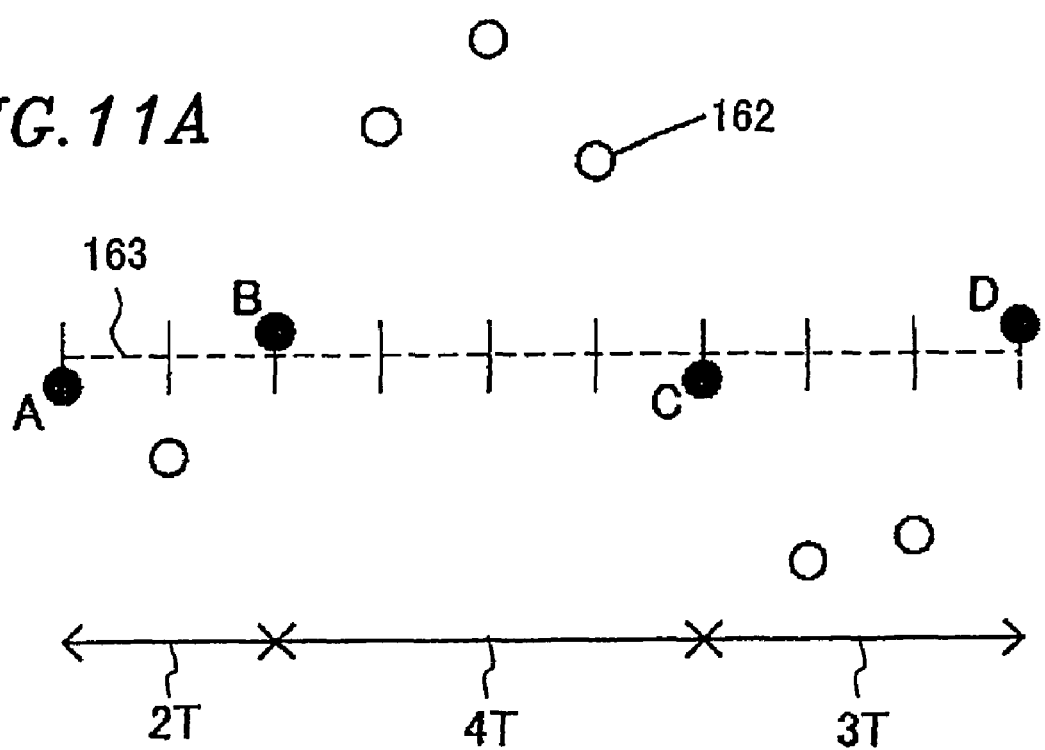
FIGS. 11A and 11B show a principle for detecting a phase error signal according to one example of the present invention.
Figure 11B:
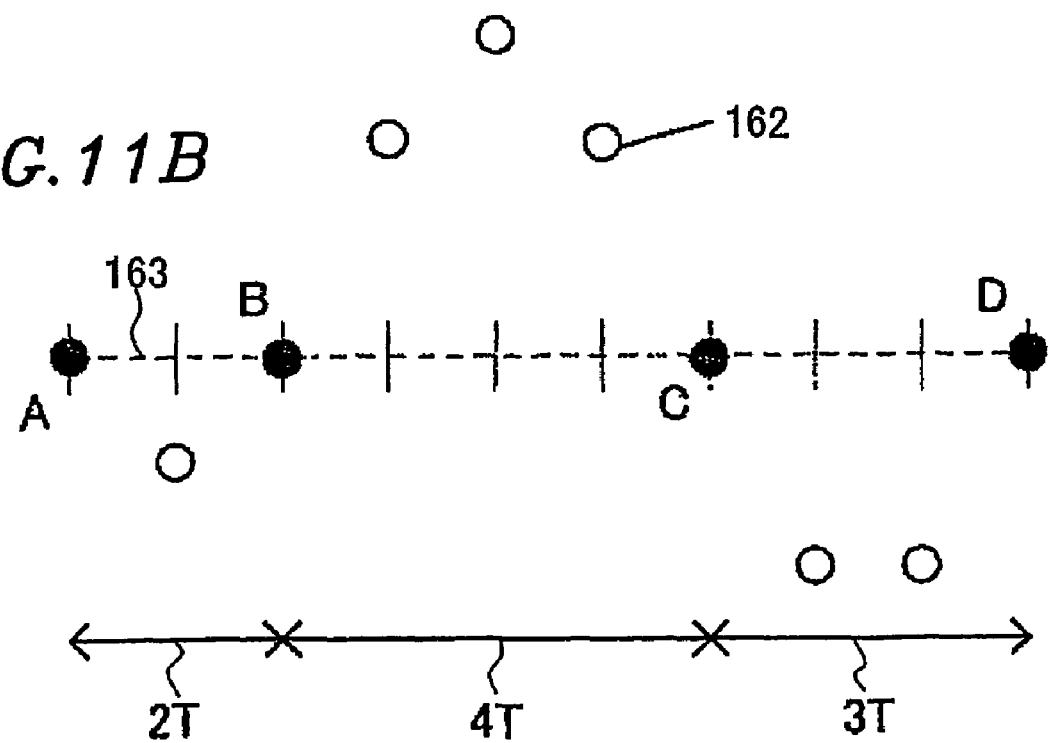

The phase error detector 12 synchronizes the phase of the clock component included in the reproduction data and the phase of the reproduction clock signal 63 based on the principle shown in FIGS. 11A and 11B. FIG. 1A shows a state in which the phase of the reproduction clock signal 63 is slightly delayed with respect to the phase of the clock component of the multiple bit digital data 64. The black circles A, B, C and D each represent a sampled point of the reproduction signal in the vicinity of a zero-cross point. It is assumed, for example, that the reproduction signal is formed of a continuous 2T4T3T waveform. An offset amount of the phase can be detected by using the information of the sampled points at rising edges (B and D) and inverting the polarity of the sampled points at falling edges (A and C). The amplitude component of each sampled point can be considered as converted into the offset in the sampled phase in the direction of time. In consideration of the rising edges and falling edges, a signal representing an amplitude component of the reproduction signal in the vicinity of the zero-cross point is generated. When the signal is detected to have a positive value, that means that the phase of the reproduction clock signal 63 is delayed with respect to the phase of the clock component of the reproduction signal. Thus, the frequency of the reproduction clock signal 63 is increased to feed the reproduction clock signal 63 back in the direction of advancing the phase. Conversely, when the signal is detected to have a negative value, that means that the phase of the reproduction clock signal 63 is advanced with respect to the phase of the clock component of the reproduction signal. Thus, the frequency of the reproduction clock signal 63 is decreased to feed the reproduction clock signal 63 back in the direction of delaying the phase. By such control, the phase error amount approaches zero, so that the phase of the reproduction clock signal 63 can be synchronized with the phase of the clock component of the reproduction data. FIG. 11B shows the case in which the phase of the reproduction clock signal 63 is in synchronization with the phase of the clock component of the reproduction data.

According to the frequency and phase control apparatus 100 of the first example of the present invention, a specific pattern length is detected based on the maximum likelihood decoding result both in a frequency and phase synchronous state and a frequency and phase asynchronous state. Therefore, the synchronization pattern length and the minimum pattern length can be detected more accurately than in the conventional art even when (i) the quality of the reproduction signal is poor, (ii) the distance between the data and the synchronization pattern is short, and (iii) the minimum pattern is provided immediately before or immediately after the synchronization pattern. Since the frequency error amount and the phase error amount can be detected with high precision, the reproduction clock signal can be synchronized stably.

According to the frequency and phase control apparatus 100, different state transition rules are used in a frequency and phase synchronous state and in a frequency and phase asynchronous state. In the frequency and phase synchronous state, a state transition rule using a symbol rule is adopted. Thus, the performance of the maximum likelihood decoder 4 can be utilized at the maximum. In the frequency and phase asynchronous state, a state transition rule which can detect even a 1T pattern is used. Thus, the specific pattern length can be detected more accurately in all the states of the frequency and phase synchronous state and in the frequency and phase asynchronous state.

EXAMPLE 2

Figure 15:
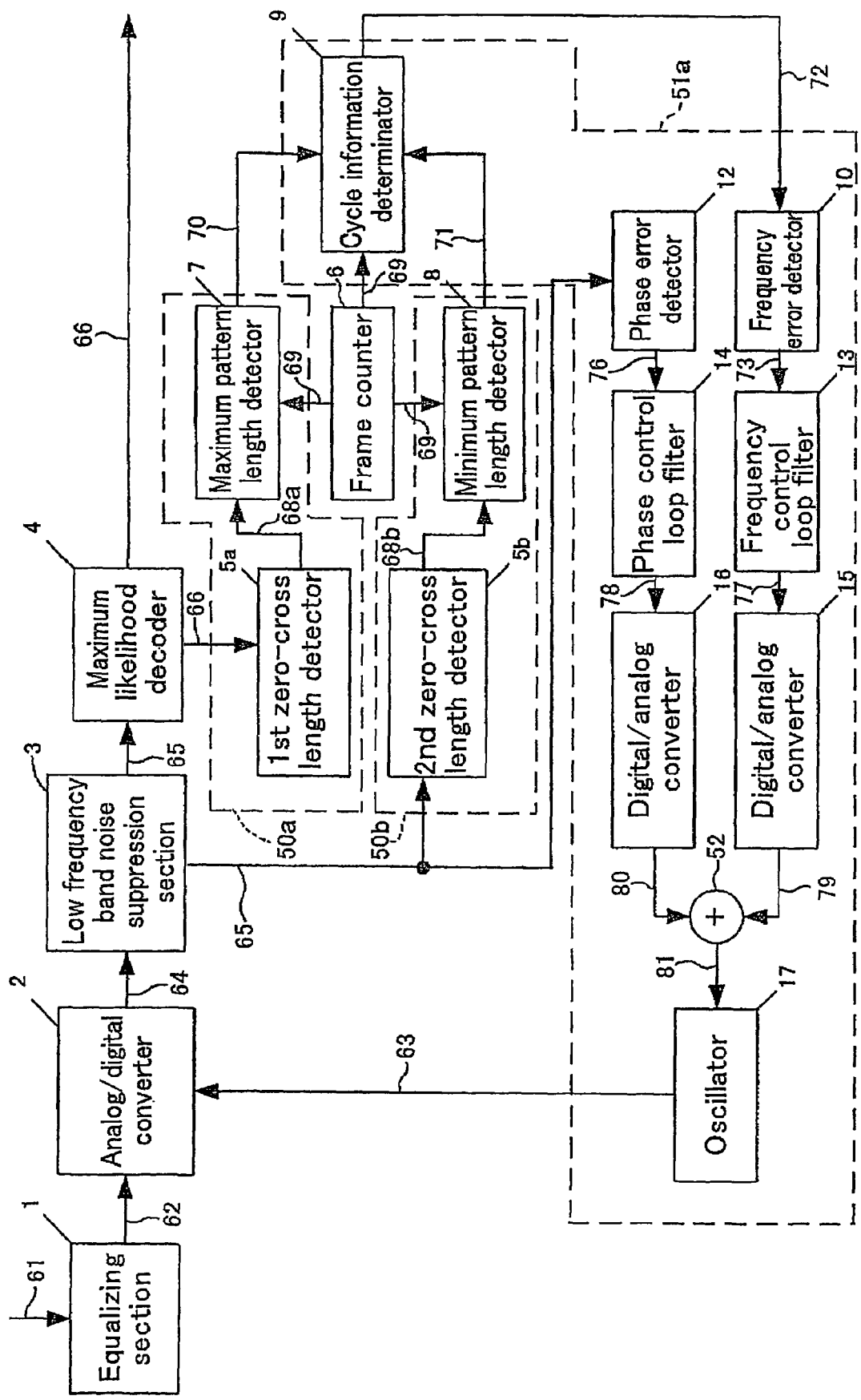
FIG. 15 is a block diagram of another frequency and phase control apparatus according to one example of the present invention.

FIG. 15 is a block diagram illustrating a frequency and phase control apparatus 200 according to a second example of the present invention.

The frequency and phase control apparatus 200 includes a waveform equalizing section 1, an analog/digital converter 2, a low frequency band noise suppression section 3, a maximum likelihood decoder 4, a first zero-cross length detection section 50a, a second zero-cross length detection section 50b, a frame counter 6, and a clock generation section 51a.

The first zero-cross length detection section 50a includes a first zero-cross length detector 5a and a maximum pattern length detector 7. The second zero-cross length detection section 50b includes a second zero-cross length detector 5b and a minimum pattern length detector 8. The clock generation section 51a includes a cycle information determinator 9, a frequency error detector 10, a phase error detector 12, a frequency control loop filter 13, a phase control loop filter 14, digital/analog converters 15 and 16, an adder 52 and an oscillation section 17.

The waveform equalizing section 1 acts as a signal input section for receiving a reproduction signal 61 from an optical head section (not shown) or the like, which has read data from an optical disc medium. The waveform equalizing section 1 corrects a reproduction signal 61 for emphasizing a high frequency band. The waveform equalizing section 1 includes a filter for arbitrarily setting a boost amount and a cut-off frequency. The filter can be, for example, a high-order ripple filter. The analog/digital converter 2 converts the reproduction signal (an analog signal labeled with 62) which is output from the waveform equalizing section 1 into a multiple bit digital signal 64 based on a reproduction clock signal 63. The low frequency band noise suppression section 3 suppresses a low frequency band noise component included in the multiple bit digital signal 64. The low frequency band noise suppression section 3 includes a circuit for detecting a DC component included in the multiple bit digital signal 64 and a circuit for subtracting the detected DC component from the multiple bit digital signal 64.

The maximum likelihood decoder 4 performs maximum likelihood decoding on the multiple bit digital signal 65 using a Viterbi algorithm to covert the multiple bit digital signal 65, having a suppressed low frequency band noise component, into a binary signal 66.

Based on the binary signal 66 output from the maximum likelihood decoder 4, the first zero-cross length detector 5a continuously detects positions at which the reproduction signal 61 cross a slicing level (zero-level). In other words, the reproduction signal 61 changes from "1" to "0" or "0" to "1" at these positions. The first zero-cross length detector 5a counts the number of samples between two adjacent zero-cross points based on the reproduction clock signal 63, and holds the counted value in a register (not shown) as a zero-cross length. The first zero-cross length detector 5a outputs a signal 68a which represents a sum of two adjacent zero-cross lengths. The second zero-cross length detector 5b continuously detects positions at which the reproduction signal 61 cross a slicing level (zero-level) from the multiple bit digital signal 65 having a suppressed low frequency band noise component. The second zero-cross length detector 5b counts the number of samples between two adjacent zero-cross points based on the reproduction clock signal 63, and holds the counted value in a register (not shown) as a zero-cross length. The second zero-cross length detector 5b outputs a signal 68b which represents a sum of two adjacent zero-cross lengths. The frame counter 6 counts and sets a specific period of one frame or greater based on the signals 68a and 68b and the reproduction clock signal 63. The frame counter 6 outputs a signal 69 which represents the set period.

The maximum pattern length detector 7 detects a maximum value among sums of two adjacent zero-cross lengths in the period represented by the signal 69, and holds the maximum value as a maximum pattern length in a register (not shown). The maximum pattern length detector 7 outputs a signal 70 which represents the maximum pattern length. The minimum pattern length detector 8 detects a minimum value among the sums of two adjacent zero-cross lengths in the period represented by the signal 69, and holds the minimum value as a minimum pattern length in a register (not shown). The minimum pattern length detector 8 outputs a signal 71 which represents the minimum pattern length. The cycle information determinator 9 compares the maximum pattern length represented by the signal 70 and the minimum pattern length represented by the signal 71, and selects an optimum value as cycle information using the ratio of the maximum pattern length and the minimum pattern length (comparison result), and outputs a select signal 72 representing the optimum value.

The frequency error detector 10 converts the difference between the value represented by the select signal 72 and the maximum pattern length or the difference between the value represented by the select signal 72 and the minimum pattern length into a frequency error amount, and outputs a signal 73 representing the frequency error amount. The maximum pattern length and the minimum pattern length are to be detected at the time of clock synchronization.

The phase error detector 12 detects phase information of the multiple bit digital signal 64 from the multiple bit digital signal 65. The phase error detector 12 outputs a signal 76 which represents the phase information. The frequency control loop filter 13 performs frequency control of the reproduction clock signal 63 until a state where the reproduction clock signal 63 can be considered to be synchronized with the multiple bit digital signal 64 is obtained, using the frequency error amount represented by the signal 73. The phase error loop filter 14 performs phase control of the reproduction clock signal 63 such that the reproduction clock signal 63 is synchronized with the multiple bit digital signal 64, using the signal 76.

The digital/analog converter 15 converts a digital signal 77 output from the frequency control loop filter 13 into an analog signal 79 and outputs the analog signal 79. The digital/analog converter 16 converts a digital signal 78 output from the phase control loop filter 14 into an analog signal 80 and outputs the analog signal 80. The adder 52 outputs a signal 81 obtained by adding the analog signals 79 and 80. The oscillator 17 generates the reproduction clock signal 63 based on the signal 81.

An operation of the frequency and phase control apparatus 200 will be further described.

The waveform equalizing section 1 corrects the reproduction signal 61 to emphasize a high frequency band. The analog/digital converter 2 converts the reproduction signal 62 output from the waveform equalizing section 1 into the multiple bit digital signal 64 based on the reproduction clock signal 63. The multiple bit digital signal 64 is in phase with the reproduction clock signal 63. All the data processing (counting and the like) to be performed after this stage is performed based on the reproduction clock signal 63. This sampled multiple bit digital signal 64 is input to the low frequency band noise suppression section 3 and has a low frequency band noise component thereof suppressed.

The signal 65 having a suppressed low frequency band noise component is input to the maximum likelihood decoder 4 and is converted into a binary signal 66 which is represented by "1" or "0". The binary signal is input to the first zero-cross length detector 5a.

The first zero-cross length detector 5a continuously detects positions at which the binary signal 66 changes from "1" to "0" or from "0" to "1". Based on the reproduction clock signal 63, the first zero-cross length detector 5a counts the number of samples between two adjacent zero-cross points, and holds the counted value in a register (not shown) as a zero-cross length.

The second zero-cross length detector 5b continuously detects positions at which the reproduction signal 61 crosses the slicing level from the multiple bit digital signal 65 having a suppressed low frequency band noise component. Based on the reproduction clock signal 63, the second zero-cross length detector 5b counts the number of samples between two adjacent zero-cross points, and holds the counted value in a register (not shown) as a zero-cross length.

The maximum pattern length detector 7 and the minimum pattern length detector 8 respectively detect a maximum value and a minimum value of sums of two adjacent zero-cross lengths in a period which is set by the frame counter 6, and each holds the maximum value or the minimum value in a register (not shown). Thus, information which is in inverse proportion to the linear velocity period of the multiple bit digital signal 64 is obtained.

The cycle information determinator 9 compares the maximum pattern length and the minimum pattern length, and selects an optimum value as cycle information using the ratio of the maximum pattern length and the minimum pattern length (comparison result), and outputs the select signal 72 representing the optimum value to the frequency error detector 10. Based on the select signal 72, the frequency error detector 10 converts the difference between the cycle information and the maximum pattern length or the difference between the cycle information and the minimum pattern length into a frequency error, and determines a frequency error amount used for performing frequency control of the reproduction clock signal 63.

The phase information of the multiple bit digital signal 64 is detected by the phase error detector 12 using the multiple bit digital signal 65 which is obtained from the low frequency band noise suppression section 3, and thus a phase error amount is determined for performing phase synchronization control of the reproduction clock signal 63 and the multiple bit digital signal 64.

The frequency control loop filter 13 controls the frequency of the reproduction clock signal 63 until a state where the reproduction clock signal 63 can be considered to be synchronized with the multiple bit digital signal 64 is obtained. Such control is performed using the frequency error amount determined by the frequency error amount detector 10. The digital/analog converter 15 converts the digital signal 77 output from the frequency control loop filter 13 into the analog signal 79 and outputs the analog signal 79.

The phase control loop filter 14 performs phase control such that the reproduction clock signal 63 is synchronized with the multiple bit digital signal 64, using the phase error amount determined by the phase error detector 12. The digital/analog converter 16 converts the digital signal 78 output from the phase control loop filter 14 to the analog signal 80, and outputs the analog signal 80.

The analog signal 79 and the analog signal 80 are added together by the adder 52, and the oscillator 17 generates the reproduction clock signal 63 based on the addition result.

The above-described series of operations allow the frequency and phase of the reproduction clock signal 63 to be synchronized with the frequency and phase of the clock component of the multiple bit digital signal 64. Thus, the data recorded on the optical disc medium can be reproduced using the reproduction clock signal 63.

According to the second example of the present invention, only a specific pattern length of the data reproduced from the optical disc medium (the length of the synchronization pattern P in FIG. 16B, i.e., the detected maximum pattern length) is identified based on a combination of run-lengths of pulse trains which are output from the maximum likelihood decoder 4. The minimum pattern length is detected by detecting the position at which the reproduction signal crosses the slicing level and measuring the zero-cross length between adjacent zero-cross points.

Hereinafter, the frequency and phase control apparatus 200 according to the second example will be described in more detail.

In the second example, the recording symbol has a minimum symbol length of 2T, and the maximum likelihood decoder 4 uses a Viterbi algorithm with the premise of a PR (a, b, b, a) system. The maximum likelihood decoder 4 performs decoding in accordance with the state transition rule shown in FIG. 12. A binary signal which is output from the maximum likelihood decoder 4 is used only for detecting a maximum pattern length. For detecting the minimum pattern length, the maximum likelihood decoding result is not used. The minimum pattern length is detected based on the positions at which the multiple bit digital signal 65 having a suppressed low frequency band noise component (output from the low frequency band noise suppression section 3) crosses the slicing level (reference level). The reason for this is as follows. As described in the first example with reference to FIG. 8, the minimum pattern is detected as 2T2T in the frequency and phase synchronous state. When the frequency of the reproduction clock signal 63 is ½ of the frequency of the reproduction clock signal 63 at the time of phase synchronization, a pattern of 1T1T needs to be detected but this cannot be detected by the processing based on the state transition rule shown in FIG. 12.

According to the frequency and phase control apparatus 200 in the second example of the present invention, the maximum pattern (synchronization pattern) is detected using the decoding result. The minimum pattern is detected based on the positions at which the signal having a suppressed low frequency band noise component crosses the slicing level. Therefore, even when the frequency of the reproduction signal is significantly changed (even when the frequency of the input reproduction signal is twice as high as a normal reproduction signal), the maximum pattern length and the minimum pattern length can be detected more accurately. Thus, the reproduction clock signal 63 can be synchronized stably.

In the first example of the present invention, when the frequency and phase control apparatus 100 is used in the system environment in which the frequency of the input reproduction signal does not change much, i.e., in which the frequency of the input reproduction signal is changed only to twice or half of the original value, the maximum likelihood decoder 4 may always perform decoding in accordance with the state transition rule based on the combination of a code word having the minimum code length of 2T and the PR (a, b, b, a) system shown in FIG. 12. In this case, it is possible to delete the calculation of the branch metric and the calculation of the path metric from the state transition rule shown in FIG. 13, and to also delete the path memory for holding the candidate strings for reproduction data from the maximum likelihood decoder 4. Thus, the circuit scale of the maximum likelihood decoder 4 can be reduced.

In the first example of the present invention, a (1, 7) RLL modulation symbol having a minimum inversion interval of 2T is used as the recording symbol. The present invention is also applicable to a recording symbol having a minimum inversion interval of 3T, which is used for CDs, DVDs, and the like. In this case, decoding is performed in accordance with the state transition rule shown in FIG. 13. In a frequency and phase asynchronous state, decoding is performed in accordance with a state transition rule obtained by deleting the path transition from state S2 to state S4 and the path transition from state S5 to state S1 from the state transition rule shown in FIG. 12. Specifically, the state transition rule in the frequency and phase synchronous state includes 6 states and 8 state transition paths. In this case, in the frequency and phase asynchronous state, the state transition rule for detecting patterns longer than or equal to pattern 2T (FIG. 12) may be used. The reason is that it is not necessary to detect a 1T pattern as long as the frequency changes within the range of ⅔ to 1.5 times the synchronized frequency.

In the second example of the present invention, (1, 7) RLL modulation symbol having a minimum inversion interval of 2T is used as the recording symbol. The present invention is also applicable to a recording symbol having a minimum inversion interval of 3T, which is used for CDs, DVDs, and the like. In this case, for detecting the maximum pattern, decoding is performed in accordance with a state transition rule obtained by deleting the path transition from state S2 to state S4 and the path transition from state S5 to state S1 from the state transition rule shown in FIG. 12. Specifically, the state transition rule in the frequency and phase synchronous state includes 6 states and 8 state transition paths.

In a synchronous state of the first example and in both a synchronous state and an asynchronous state of the second example, the maximum likelihood decoder 4 performs decoding in accordance with a state transition rule based on a combination of a recording symbol having a minimum inversion interval of 2T and the PR (a, b, b, a) system. This state transition rule includes 6 states and 10 state transition paths.

In an asynchronous state of the first example, the maximum likelihood decoder 4 performs decoding in accordance with a state transition rule based on a combination of a recording symbol having a minimum inversion interval of 1T and the PR (a, b, b, a) system. This state transition rule includes 8 states and 16 state transition paths.

In a synchronous state of the first example and in both a synchronous state and an asynchronous state of the second example, the maximum likelihood decoder 4 may perform decoding in accordance with a state transition rule based on a combination of a recording symbol having a minimum inversion interval of 3T and the PR (a, b, b, a) system. This state transition rule includes 6 states and 8 state transition paths. In an asynchronous state of the first example, the maximum likelihood decoder 4 may perform decoding in accordance with a state transition rule based on a combination of a recording symbol having a minimum inversion interval of 2T and the PR (a, b, b, a) system. This state transition rule includes 6 states and 12 state transition paths.

In the first and second examples, the maximum likelihood decoder 4 uses a Viterbi algorithm with a premise of the PR (a, b, b, a) system. The present invention is not limited to using the PR system. For example, other PR systems including the PR (a, b, a) system, PR (a, b, b, a) system, and PR (a, b, c, b, a) system may be used. Here, "a", "b" and "c" represent an arbitrary constant. Constants a, b and c may have the relationships of a=b, a=c, b=c, or a =b=c. The maximum likelihood decoder 4 performs decoding using a Viterbi algorithm with a premise of any of these systems.

The state transition rule with a premise of the PR (a, b, b, a) system was described above with reference to Tables 1 and 2 and FIGS. 12 and 13. The state transition rule with a premise of the PR (a, b, a) system and the state transition rule with a premise of the PR (a, b, c, b, a) system will be described with reference to Tables 3, 4, 5 and 6 and FIGS. 18, 19, 20 and 21.

The following description will be performed in the case of a recording symbol having a minimum inversion interval of 2T or 1T, but the present invention is applicable to the case of a recording symbol having a minimum inversion interval of 3T. In this case also, the maximum likelihood decoder 4 can perform decoding using a Viterbi algorithm with a premise of any of the above-mentioned systems.

Figure 18:
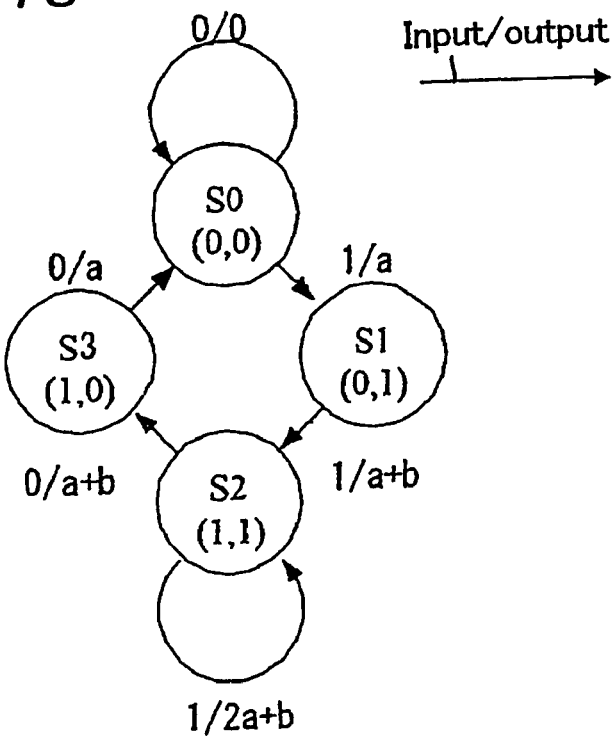
FIG. 18 shows a state transition based on a combination of a code word having a minimum symbol length of 2T and the PR (a, b, a) system according to one example of the present invention.

Table 3 shows a state transition rule based on a combination of a recording symbol having a minimum inversion interval of 2T and the PR (a, b, a) system. FIG. 18 shows such a state transition rule.

TABLE 3

State transitions based on a combination of a recording symbol having a minimum inversion interval of 2T and the PR (a, b, a) system

| State at time k − 1 $S(b_{k-3}, b_{k-2}, b_{k-1})$ | Input at time k $b_k$ | Signal level |
|---|---|---|
| S(0, 0) | 0 | 0 |
| S(0, 0) | 1 | a |
| S(0, 1) | 1 | a + b |
| S(1, 0) | 0 | a |
| S(1, 1) | 0 | a + b |
| S(1, 1) | 1 | 2a + b |

Figure 19:
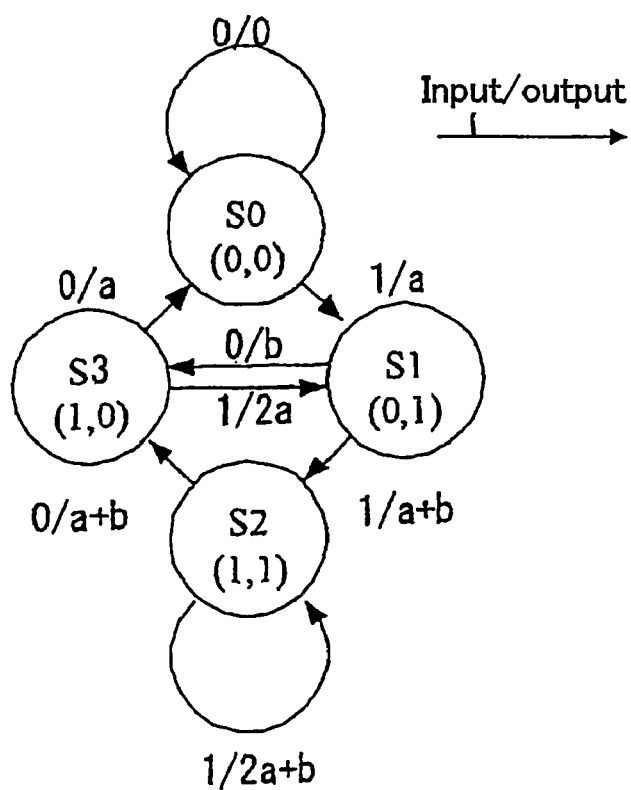
FIG. 19 shows a state transition based on a combination of a code word having a minimum symbol length of 1T and the PR (a, b, a) system according to one example of the present invention.

Table 4 shows a state transition rule based on a combination of a recording symbol having a minimum inversion interval of 1T and the PR (a, b, a) system. FIG. 19 shows such a state transition rule.

TABLE 4

State transitions based on a combination of
a recording symbol having a minimum inversion
interval of 1T and the PR (a, b, a) system

| State at time k − 1<br>S($b_{k-3}, b_{k-2}, b_{k-1}$) | Input at time k<br>$b_k$ | Signal level |
|---|---|---|
| S(0, 0) | 0 | 0 |
| S(0, 0) | 1 | a |
| S(0, 1) | 0 | b |
| S(0, 1) | 1 | a + b |
| S(1, 0) | 0 | a |
| S(1, 0) | 1 | 2a |
| S(1, 1) | 0 | a + b |
| S(1, 1) | 1 | 2a + b |

In a synchronous state of the first example and in both a synchronous state and an asynchronous state of the second example, the maximum likelihood decoder 4 performs decoding in accordance with a state transition rule based on a combination of a recording symbol having a minimum inversion interval of 2T and the PR (a, b, a) system. This state transition rule includes 4 states and 6 state transition paths. In an asynchronous state of the first example, the maximum likelihood decoder 4 performs decoding in accordance with a state transition rule based on a combination of a recording symbol having a minimum inversion interval of 1T and the PR (a, b, a) system. This state transition rule includes 4 states and 8 state transition paths.

In a synchronous state of the first example and in both a synchronous state and an asynchronous state of the second example, the maximum likelihood decoder 4 may perform decoding in accordance with a state transition rule based on a combination of a recording symbol having a minimum inversion interval of 3T and the PR (a, b, a) system. This state transition rule includes 4 states and 6 state transition paths. In an asynchronous state of the first example, the maximum likelihood decoder 4 may perform decoding in accordance with a state transition rule based on a combination of a recording symbol having a minimum inversion interval of 2T and the PR (a, b, a) system. This state transition rule includes 4 states and 6 state transition paths.

Figure 20:
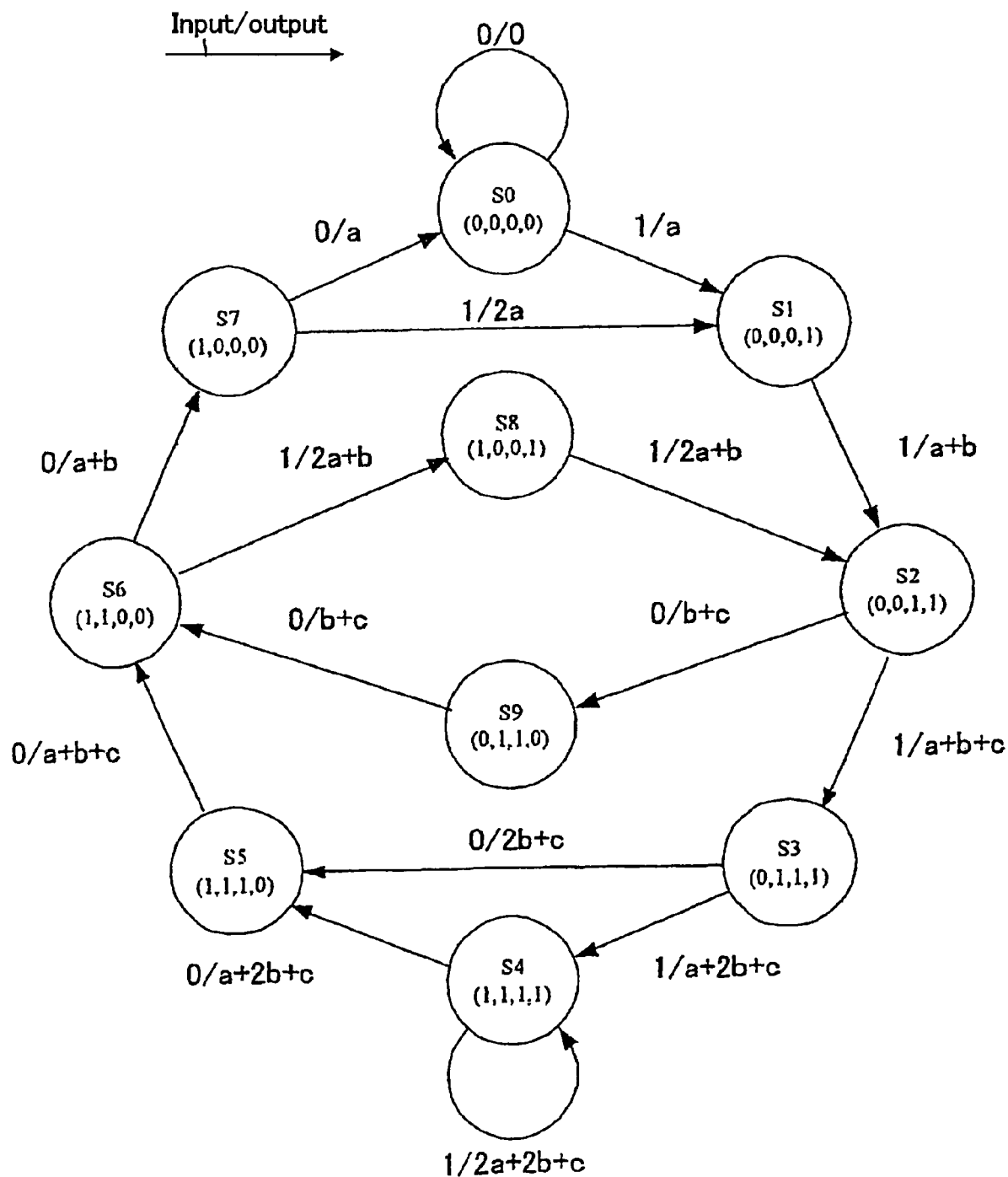
FIG. 20 shows a state transition based on a combination of a code word having a minimum symbol length of 2T and the PR (a, b, c, b, a) system according to one example of the present invention.

Table 5 shows a state transition rule based on a combination of a recording symbol having a minimum inversion interval of 2T and the PR (a, b, c, b, a) system. FIG. 20 shows such a state transition rule.

TABLE 5

State transitions based on a combination of a
recording symbol having a minimum inversion interval
of 2T and the PR (a, b, c, b, a) system

| State at time k − 1<br>S($b_{k-4}, b_{k-3}, b_{k-2}, b_{k-1}$) | Input at time k<br>$b_k$ | Signal level |
|---|---|---|
| S(0, 0, 0, 0) | 0 | 0 |
| S(0, 0, 0, 0) | 1 | A |
| S(0, 0, 0, 1) | 1 | a + b |
| S(0, 0, 1, 1) | 0 | B + c |
| S(0, 0, 1, 1) | 1 | a + b + c |
| S(0, 1, 1, 0) | 0 | B + c |
| S(0, 1, 1, 1) | 0 | 2b + c |
| S(0, 1, 1, 1) | 1 | a + 2b + c |
| S(1, 0, 0, 0) | 0 | A |
| S(1, 0, 0, 0) | 1 | 2a |
| S(1, 0, 0, 1) | 1 | 2a + b |
| S(1, 1, 0, 0) | 0 | A + b |
| S(1, 1, 0, 0) | 1 | 2A + b |
| S(1, 1, 1, 0) | 0 | A + b + c |

TABLE 5-continued

State transitions based on a combination of a
recording symbol having a minimum inversion interval
of 2T and the PR (a, b, c, b, a) system

| State at time k − 1<br>S($b_{k-4}, b_{k-3}, b_{k-2}, b_{k-1}$) | Input at time k<br>$b_k$ | Signal level |
|---|---|---|
| S(1, 1, 1, 1) | 0 | A + 2b + c |
| S(1, 1, 1, 1) | 1 | 2a + 2b + c |

Figure 21:
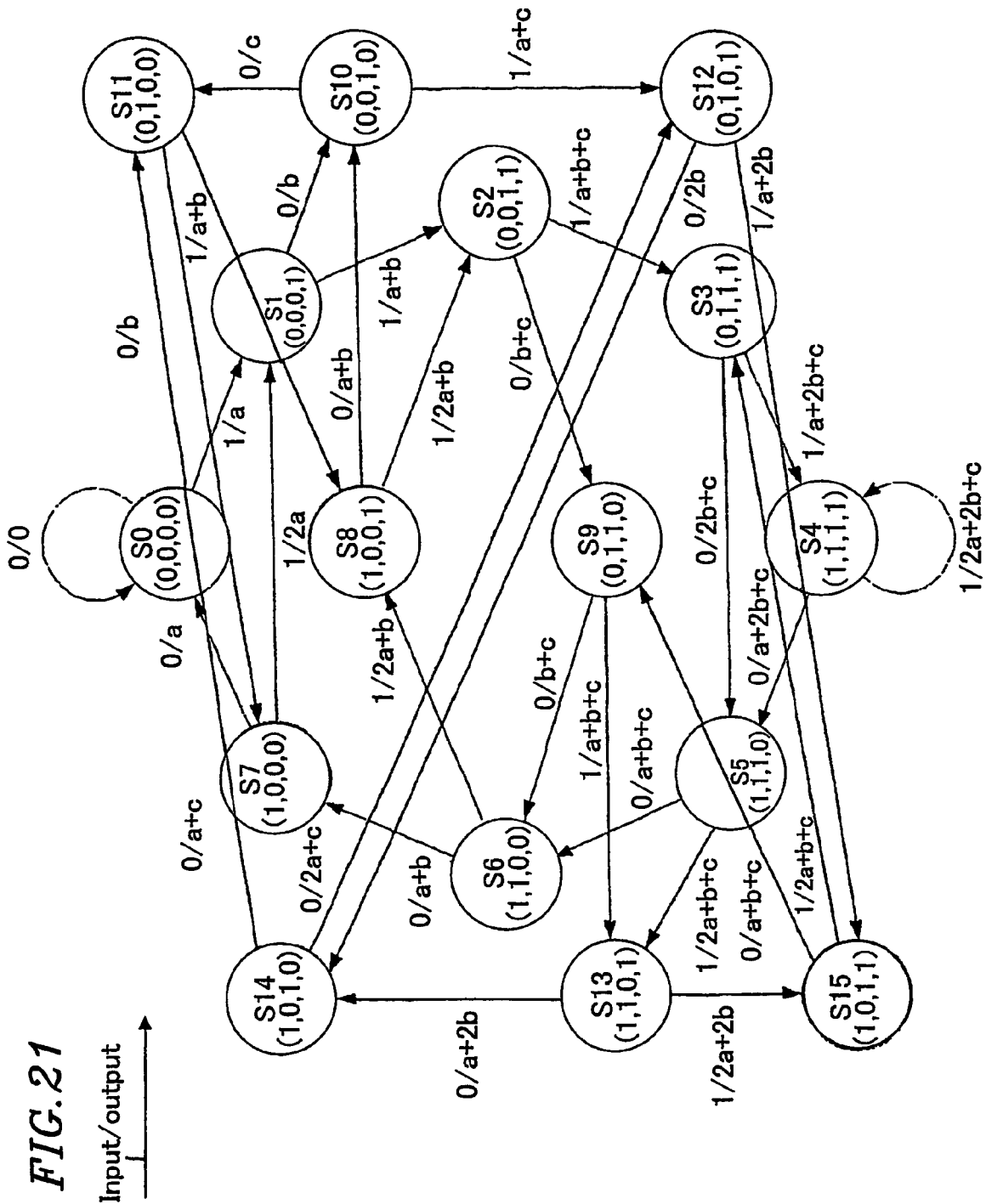
FIG. 21 shows a state transition based on a combination of a code word having a minimum symbol length of 1T and the PR (a, b, c, b, a) system according to one example of the present invention.
Figure 22:
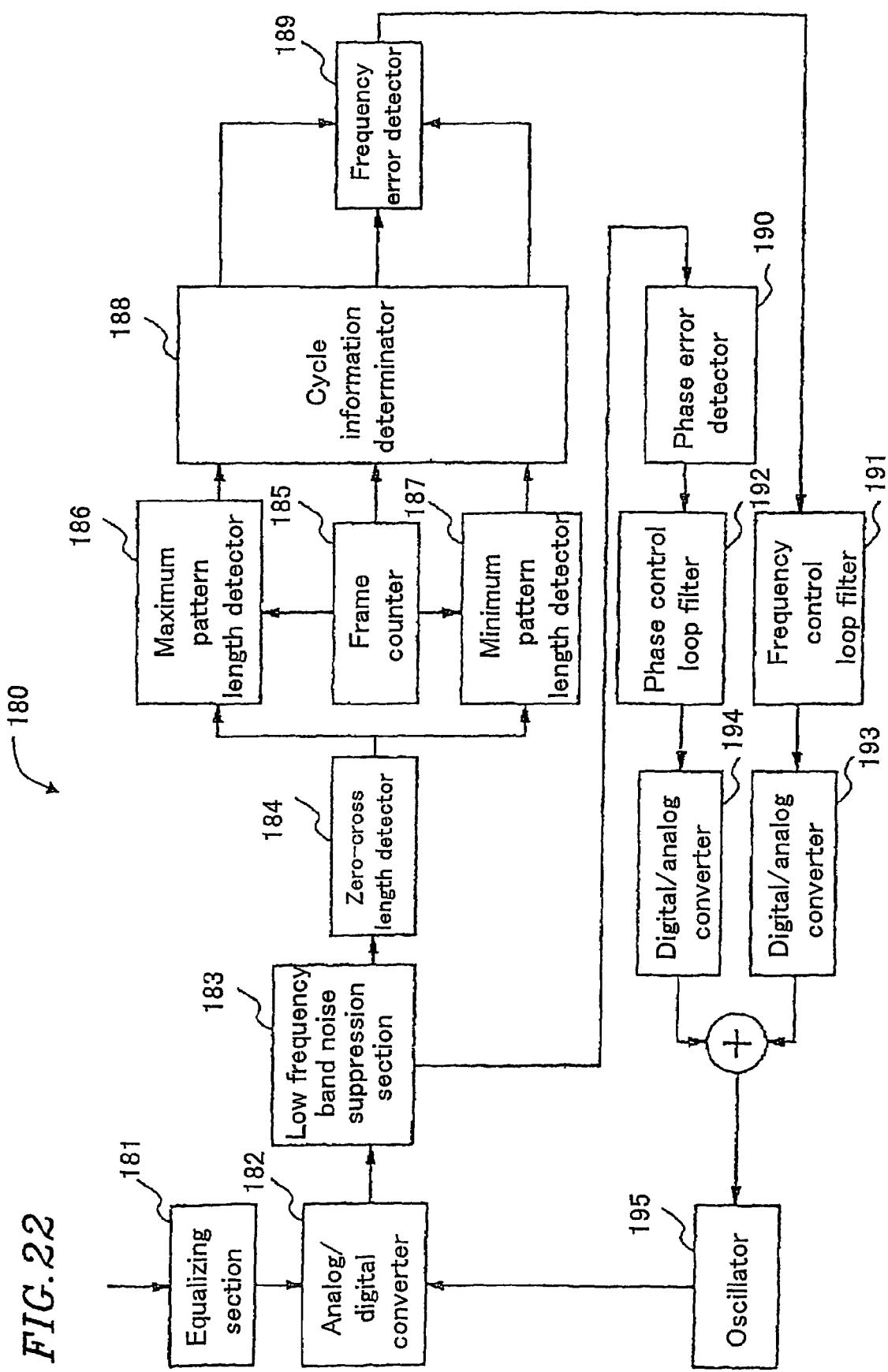
FIG. 22 is a block diagram illustrating a conventional frequency and phase control apparatus.

Table 6 shows a state transition rule based on a combination of a recording symbol having a minimum inversion interval of 1T and the PR (a, b, c, b, a) system. FIG. 21 shows such a state transition rule.

TABLE 6

State transitions based on a combination of a
recording symbol having a minimum inversion interval
of 1T and the PR (a, b, c, b, a) system

| State at time k − 1<br>S($b_{k-4}, b_{k-3}, b_{k-2}, b_{k-1}$) | Ibput at time k<br>$b_k$ | Signal level |
|---|---|---|
| S(0, 0, 0, 0) | 0 | 0 |
| S(0, 0, 0, 0) | 1 | A |
| S(0, 0, 0, 1) | 0 | B |
| S(0, 0, 0, 1) | 1 | a + b |
| S(0, 0, 1, 0) | 0 | C |
| S(0, 0, 1, 0) | 1 | a + b |
| S(0, 0, 1, 1) | 0 | B + c |
| S(0, 0, 1, 1) | 1 | a + b + c |
| S(0, 1, 0, 0) | 0 | B |
| S(0, 1, 0, 0) | 1 | A + b |
| S(0, 1, 0, 1) | 0 | 2b |
| S(0, 1, 0, 1) | 1 | a + 2b |
| S(0, 1, 1, 0) | 0 | B + c |
| S(0, 1, 1, 0) | 1 | a + b + c |
| S(0, 1, 1, 1) | 0 | 2b + c |
| S(0, 1, 1, 1) | 1 | a + 2b + c |
| S(1, 0, 0, 0) | 0 | A |
| S(1, 0, 0, 0) | 1 | 2a |
| S(1, 0, 0, 1) | 0 | A + b |
| S(1, 0, 0, 1) | 1 | 2a + b |
| S(1, 0, 1, 0) | 0 | A + c |
| S(1, 0, 1, 0) | 1 | 2A + C |
| S(1, 0, 1, 1) | 0 | A + b + c |
| S(1, 0, 1, 1) | 1 | 2a + b + c |
| S(1, 1, 0, 0) | 0 | A + b |
| S(1, 1, 0, 0) | 1 | 2A + b |
| S(1, 1, 0, 1) | 0 | A + 2b |
| S(1, 1, 0, 1) | 1 | 2a + 2b |
| S(1, 1, 1, 0) | 0 | A + b + c |
| S(1, 1, 1, 0) | 1 | 2a + b + c |
| S(1, 1, 1, 1) | 0 | A + 2b + c |
| S(1, 1, 1, 1) | 1 | 2a + 2b + c |

In a synchronous state of the first example and in both a synchronous state and an asynchronous state of the second example, the maximum likelihood decoder 4 performs decoding in accordance with a state transition rule based on a combination of a recording symbol having a minimum inversion interval of 2T and the PR (a, b, c, b, a) system. This state transition rule includes 10 states and 16 state transition paths. In an asynchronous state of the first example, the maximum likelihood decoder 4 performs decoding in accordance with a state transition rule based on a combination of a recording symbol having a minimum inversion interval of 1T and the PR (a, b, c, b, a) system. This state transition rule includes 16 states and 32 state transition paths.

In a synchronous state of the first example and in both a synchronous state and an asynchronous state of the second example, the maximum likelihood decoder 4 may perform decoding in accordance with a state transition rule based on a combination of a recording symbol having a minimum inversion interval of 3T and the PR (a, b, c, b, a) system. This state transition rule includes 8 states and 12 state transition paths. In an asynchronous state of the first example, the maximum likelihood decoder 4 may perform decoding in accordance with a state transition rule based on a combination of a recording symbol having a minimum inversion interval of 2T and the PR (a, b, c, b, a) system. This state transition rule includes 10 states and 16 state transition paths.

In the first and second examples, the maximum pattern length and the minimum pattern length are detected by either (i) using a combination of run-lengths of pulse strings (pattern matching method) or (ii) detecting positions at which a reproduction signal crosses the slicing level and measuring the zero-cross length between two adjacent zero-cross points. Either one is usable. Namely, the measurement may be performed using NRZ (Non Return to Zero) or NRZI (Non Return to Zero Inverted).

INDUSTRIAL APPLICABILITY

According to a frequency and phase control apparatus of the present invention, a specific pattern length is detected based on the maximum likelihood decoding result both in a frequency and phase synchronous state and a frequency and phase asynchronous state. Therefore, the synchronization pattern length and the minimum pattern length can be detected more accurately than in the conventional art even when (i) the quality of the reproduction signal is poor, (ii) the distance between the data and the synchronization pattern is short, and (iii) the minimum pattern is provided immediately before or immediately after the synchronization pattern. Since the frequency error amount and the phase error amount can be detected with high precision, the reproduction clock signal can be synchronized stably.

According to a frequency and phase control apparatus and a maximum likelihood decoder of the present invention, different state transition rules are used in a frequency and phase synchronous state and in a frequency and phase asynchronous state. Since a state transition rule using a symbol rule is adopted in the frequency and phase synchronous state, the performance of the maximum likelihood decoder can be utilized at the maximum. In the frequency and phase asynchronous state, a state transition rule which can detect even a 1T pattern is used. Thus, the specific pattern length can be detected more accurately in all the states of the frequency and phase synchronous state and in the frequency and phase asynchronous state.

A frequency and phase control apparatus and a maximum likelihood decoder of the present invention are especially useful for synchronization based on a clock signal.

According to one aspect of the invention, a frequency and phase control apparatus includes a signal input section for receiving a reproduction signal; an analog/digital conversion section for converting the reproduction signal into a multiple bit digital signal based on a clock signal; a maximum likelihood decoding section for converting the multiple bit digital signal into a binary signal; a pattern detection section for detecting a pattern of the binary signal; a determination section for determining whether or not the multiple bit digital signal and the clock signal are in synchronization with each other based on the detection result; and a clock generation section for adjusting at least one of a frequency and a phase of the clock signal based on the detection result and outputting the adjusted clock signal. When the determination result of the determination section indicates that the multiple bit digital signal and the clock signal are in synchronization with each other, the maximum likelihood decoding section generates a binary signal based on a first state transition rule; and when the determination result of the determination section indicates that the multiple bit digital signal and the clock signal are not in synchronization with each other, the maximum likelihood decoding section generates a binary signal based on a second state transition rule.

According to another aspect of the invention, a frequency and phase control apparatus includes a signal input section for receiving a reproduction signal; an analog/digital conversion section for converting the reproduction signal into a multiple bit digital signal based on a clock signal; a maximum likelihood decoding section for converting the multiple bit digital signal into a binary signal; a maximum cross length detection section for detecting a plurality of cross lengths each representing a length between two adjacent cross points among a plurality of cross points at which the reproduction signal crosses a prescribed slicing level, and detecting a maximum value among sums of two adjacent cross lengths; a minimum cross length detection section for detecting the plurality of cross lengths and detecting a minimum value among the sums of the two adjacent cross lengths; and a clock generation section for adjusting at least one of a frequency and a phase of the clock signal based on the maximum value and the minimum value, and outputting the adjusted clock signal. The maximum cross length detection section detects the maximum value based on the binary signal.

In one embodiment of the invention, the maximum likelihood decoding section generates a binary signal based on a state transition rule. A number of states and a number of state transition paths of the state transition rule are restricted based on a minimum inversion interval defined by a prescribed symbol rule.

In one embodiment of the invention, the minimum inversion interval is 2, and the state transition rule includes 6 states and 10 state transition paths based on a combination of a recording symbol having the minimum inversion interval and a PR (a, b, b, a) system.

In one embodiment of the invention, the minimum inversion interval is 3, and the state transition rule includes 6 states and 8 state transition paths based on a combination of a recording symbol having the minimum inversion interval and a PR (a, b, b, a) system.

In one embodiment of the invention, the minimum inversion interval is 2, and the state transition rule includes 4 states and 6 state transition paths based on a combination of a recording symbol having the minimum inversion interval and a PR (a, b, a) system.

In one embodiment of the invention, the minimum inversion interval is 3, and the state transition rule includes 4 states and 6 state transition paths based on a combination of a recording symbol having the minimum inversion interval and a PR (a, b, a) system.

In one embodiment of the invention, the minimum inversion interval is 2, and the state transition rule includes 10 states and 16 state transition paths based on a combination of a recording symbol having the minimum inversion interval and a PR (a, b, c, b, a) system.

In one embodiment of the invention, the minimum inversion interval is 3, and the state transition rule includes 8 states and 12 state transition paths based on a combination of a recording symbol having the minimum inversion interval and a PR (a, b, c, b, a) system.

According to still another aspect of the invention, a maximum likelihood decoder is provided for receiving a multiple bit digital signal generated based on a clock signal and a flag indicating whether or not the multiple bit digital signal and the clock signal are in synchronization with each other, and converting the multiple bit digital signal into a binary signal based on the flag. When the flag indicates that the multiple bit digital signal and the clock signal are in synchronization with each other, the maximum likelihood decoder generates a binary signal based on a first state transition rule, and when the flag indicates that the multiple bit digital signal and the clock signal are not in synchronization with each other, the maximum likelihood decoder generates a binary signal based on a second state transition rule.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

The invention claimed is:

1. A frequency control apparatus, comprising:
a signal input section for inputting a reproduction signal from a recording medium, wherein a recording symbol is encoded by (1, 7) RLL modulation system and a synchronization pattern includes 2T9T9T when a standard cycle of a symbol length of the recording symbol is defined as T;
an analog/digital conversion section for converting the reproduction signal into a multiple bit digital signal based on a clock signal;
a low noise suppression section for suppressing low noise component included in the multiple bit digital signal;
a maximum likelihood decoding section for performing a maximum likelihood decoding on the multiple bit digital signal having the suppressed low noise component in accordance with a state transition rule along the (1, 7) RLL modulation system and converting the multiple bit digital signal into a binary signal;
a maximum pattern length detection section for detecting a maximum pattern length during a predetermined period from the binary signal converted by the maximum likelihood decoding section;
a minimum pattern length detection section for detecting a minimum pattern length during the predetermined period from the multiple bit digital signal having the suppressed low noise component;
a cycle information determination section for selecting the maximum pattern length or the minimum pattern length that is considered optimum as cycle information from the detected maximum pattern length and minimum pattern length based on a comparison result of the detected maximum pattern length and minimum pattern length;
a frequency error detection section for determining a frequency error amount based on a difference between the maximum pattern length or the minimum pattern length detected when a cycle of the clock signal is the standard cycle T the cycle information; and
a clock oscillation section for adjusting the frequency of the clock signal based on the determined frequency error amount and outputting the adjusted clock signal.

2. A frequency control method, comprising the steps of:
inputting a reproduction signal from a recording medium, wherein a recording symbol is encoded by (1, 7) RLL modulation system and a synchronization pattern includes 2T9T9T when a standard cycle of a symbol length of the recording symbol is defined as T;
converting the reproduction signal into a multiple bit digital signal based on a clock signal;
suppressing low noise component included in the multiple bit digital signal;
performing a maximum likelihood decoding on the multiple bit digital signal having the suppressed low noise component in accordance with a state transition rule along the (1, 7) RLL modulation system and converting the multiple bit digital signal into a binary signal;
detecting a maximum pattern length during a predetermined period from the binary signal converted by the maximum likelihood decoding section;
detecting a minimum pattern length during the predetermined period from the multiple bit digital signal having the suppressed low noise component;
selecting the maximum pattern length or the minimum pattern length that is considered optimum as cycle information from the detected maximum pattern length and minimum pattern length based on a comparison result of the detected maximum pattern length and minimum pattern length;
determining a frequency error amount based on a difference between the maximum pattern length or the minimum pattern length detected when a cycle of the clock signal is the standard cycle T and the cycle information; and
adjusting the frequency of the clock signal based on the determined frequency error amount and outputting the adjusted clock signal.

3. An information reproduction apparatus for reproducing information from an information recording medium, the apparatus comprising:
a signal input section for inputting a reproduction signal from a recording medium, wherein a recording symbol is encoded by (1, 7) RLL modulation system and a synchronization pattern includes 2T9T9T when a standard cycle of a symbol length of the recording symbol is defined as T;
an analog/digital conversion section for converting the reproduction signal into a multiple bit digital signal based on a clock signal;
a low noise suppression section for suppressing low noise component included in the multiple bit digital signal;
a maximum likelihood decoding section for performing a maximum likelihood decoding on the multiple bit digital signal having the suppressed low noise component in accordance with a state transition rule along the (1, 7) RLL modulation system and converting the multiple bit digital signal into a binary signal;
a maximum pattern length detection section for detecting a maximum pattern length during a predetermined period from the binary signal converted by the maximum likelihood decoding section;
a minimum pattern length detection section for detecting a minimum pattern length during the predetermined period from the multiple bit digital signal having the suppressed low noise component;
a cycle information determination section for selecting the maximum pattern length or the minimum pattern length that is considered optimum as cycle information from the detected maximum pattern length and minimum pattern length based on a comparison result of the detected maximum pattern length and minimum pattern length;
a frequency error detection section for determining a frequency error amount based on a difference between the maximum pattern length or the minimum pattern length detected when a cycle of the clock signal is the standard cycle T and the cycle information;

a clock oscillation section for adjusting the frequency of the clock signal based on the determined frequency error amount and outputting the adjusted clock signal; and a reproduction section for reproducing information from the information recording medium based on the adjusted clock signal.

4. An information reproducing method for reproducing information from an information recording medium, the method comprising the steps of:

inputting a reproduction signal from a recording medium, wherein a recording symbol is encoded by (1, 7) RLL modulation system and a synchronization pattern includes 2T9T9T when a standard cycle of a symbol length of the recording symbol is defined as T;

converting the reproduction signal into a multiple bit digital signal based on a clock signal;

suppressing low noise component included in the multiple bit digital signal;

performing a maximum likelihood decoding on the multiple bit digital signal having the suppressed low noise component in accordance with a state transition rule along the (1, 7) RLL modulation system and converting the multiple bit digital signal into a binary signal;

detecting a maximum pattern length during a predetermined period from the binary signal converted by the maximum likelihood decoding section;

detecting a minimum pattern length during the predetermined period from the multiple bit digital signal having the suppressed low noise component;

selecting the maximum pattern length or the minimum pattern length that is considered optimum as cycle information from the detected maximum pattern length and minimum pattern length based on a comparison result of the detected maximum pattern length and minimum pattern length;

determining a frequency error amount based on a difference between the maximum pattern length or the minimum pattern length detected when a cycle of the clock signal is the standard cycle T and the cycle information;

adjusting the frequency of the clock signal based on the determined frequency error amount and outputting the adjusted clock signal; and reproducing information from the information recording medium based on the adjusted clock signal.

* * * * *